(12) United States Patent (10) Patent No.: US 8,891,303 B1
Higgins et al. (45) Date of Patent: Nov. 18, 2014

(54) METHOD AND SYSTEM FOR DYNAMIC WORD LINE BASED CONFIGURATION OF A THREE-DIMENSIONAL MEMORY DEVICE

(71) Applicant: SanDisk Enterprise IP LLC, Milpitas, CA (US)

(72) Inventors: James M. Higgins, Chandler, AZ (US); Robert W. Ellis, Phoenix, AZ (US); Neil R. Darragh, Edinburgh (GB); Aaron K. Olbrich, Morgan Hill, CA (US); Navneeth Kankani, Fremont, CA (US); Steven Sprouse, San Jose, CA (US)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 14/298,841

(22) Filed: Jun. 6, 2014

Related U.S. Application Data

(60) Provisional application No. 62/005,930, filed on May 30, 2014.

(51) Int. Cl.
*G11C 11/34* (2006.01)
*G11C 16/10* (2006.01)

(52) U.S. Cl.
CPC .................................... *G11C 16/10* (2013.01)
USPC .................... 365/185.1; 365/63; 365/185.14; 365/185.18

(58) Field of Classification Search
USPC .................................... 365/63, 185.1, 185.14
See application file for complete search history.

(56) References Cited

U.S. PATENT DOCUMENTS

| | | | |
|---|---|---|---|
| 4,916,652 | A | 4/1990 | Schwarz et al. |
| 5,519,847 | A | 5/1996 | Fandrich et al. |
| 5,530,705 | A | 6/1996 | Malone |
| 5,537,555 | A | 7/1996 | Landry |
| 5,551,003 | A | 8/1996 | Mattson et al. |

(Continued)

FOREIGN PATENT DOCUMENTS

| | | |
|---|---|---|
| EP | 1 465 203 A1 | 10/2004 |
| EP | 1 990 921 A2 | 11/2008 |

(Continued)

OTHER PUBLICATIONS

Barr, Introduction to Watchdo. Timers, Oct. 2001, 3 pgs.

(Continued)

*Primary Examiner* — Anthan Tran
(74) *Attorney, Agent, or Firm* — Morgan, Lewis & Bockius LLP

(57) ABSTRACT

A memory controller configures a plurality of word lines associated with a respective block of a 3D memory device in a first configuration, where the first configuration includes a set of configuration parameters for each word line of the plurality of word lines determined at least in part on the vertical positions of each word line relative to a substrate of the 3D memory device and, while the plurality of word lines are configured in the first configuration, writes data to and reads data from the respective block. For the respective block, the memory controller: adjusts a first parameter in the respective set of configuration parameters corresponding to a respective word line of the plurality of word lines in response to detecting a first trigger condition as to the respective word line and, after adjusting the first parameter, writes data to and reads data from the respective word line.

25 Claims, 13 Drawing Sheets

(56) References Cited

U.S. PATENT DOCUMENTS

| | | |
|---|---|---|
| 5,657,332 A | 8/1997 | Auclair et al. |
| 5,666,114 A | 9/1997 | Brodie et al. |
| 5,708,849 A | 1/1998 | Coke et al. |
| 5,943,692 A | 8/1999 | Marberg et al. |
| 5,982,664 A | 11/1999 | Watanabe |
| 6,000,006 A | 12/1999 | Bruce et al. |
| 6,016,560 A | 1/2000 | Wada et al. |
| 6,018,304 A | 1/2000 | Bessios |
| 6,070,074 A | 5/2000 | Perahia et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,295,592 B1 | 9/2001 | Jeddeloh et al. |
| 6,311,263 B1 | 10/2001 | Barlow et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,678,788 B1 | 1/2004 | O'Connell |
| 6,757,768 B1 | 6/2004 | Potter et al. |
| 6,775,792 B2 | 8/2004 | Ulrich et al. |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,871,257 B2 | 3/2005 | Conley et al. |
| 6,895,464 B2 | 5/2005 | Chow et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,032,123 B2 | 4/2006 | Kane et al. |
| 7,043,505 B1 | 5/2006 | Teague et al. |
| 7,100,002 B2 | 8/2006 | Shrader et al. |
| 7,111,293 B1 | 9/2006 | Hersh et al. |
| 7,162,678 B2 | 1/2007 | Saliba |
| 7,173,852 B2 | 2/2007 | Gorobets et al. |
| 7,184,446 B2 | 2/2007 | Rashid et al. |
| 7,328,377 B1 | 2/2008 | Lewis et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,571,277 B2 | 8/2009 | Mizushima |
| 7,574,554 B2 | 8/2009 | Tanaka et al. |
| 7,596,643 B2 | 9/2009 | Merry et al. |
| 7,681,106 B2 | 3/2010 | Jarrar et al. |
| 7,685,494 B1 | 3/2010 | Varnica et al. |
| 7,707,481 B2 | 4/2010 | Kirschner et al. |
| 7,761,655 B2 | 7/2010 | Mizushima et al. |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich |
| 7,996,642 B1 | 8/2011 | Smith |
| 8,006,161 B2 | 8/2011 | Lestable et al. |
| 8,032,724 B1 | 10/2011 | Smith |
| 8,069,390 B2 | 11/2011 | Lin |
| 8,190,967 B2 | 5/2012 | Hong et al. |
| 8,254,181 B2 | 8/2012 | Hwang et al. |
| 8,312,349 B2 | 11/2012 | Reche et al. |
| 8,412,985 B1 | 4/2013 | Bowers et al. |
| 2002/0024846 A1 | 2/2002 | Kawahara et al. |
| 2002/0083299 A1 | 6/2002 | Van Huben et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid |
| 2003/0088805 A1 | 5/2003 | Majni et al. |
| 2003/0093628 A1 | 5/2003 | Matter et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0073829 A1 | 4/2004 | Olarig |
| 2004/0153902 A1 | 8/2004 | Machado et al. |
| 2004/0181734 A1 | 9/2004 | Saliba |
| 2004/0199714 A1 | 10/2004 | Estakhri et al. |
| 2004/0237018 A1 | 11/2004 | Riley |
| 2005/0060456 A1 | 3/2005 | Shrader et al. |
| 2005/0060501 A1 | 3/2005 | Shrader |
| 2005/0114587 A1 | 5/2005 | Chou et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0039196 A1 | 2/2006 | Gorobets et al. |
| 2006/0053246 A1 | 3/2006 | Lee |
| 2006/0085671 A1 | 4/2006 | Majni et al. |
| 2006/0136570 A1 | 6/2006 | Pandya |
| 2006/0156177 A1 | 7/2006 | Kottapalli et al. |
| 2006/0195650 A1 | 8/2006 | Su et al. |
| 2006/0259528 A1 | 11/2006 | Dussud et al. |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0113019 A1 | 5/2007 | Beukema |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0277036 A1 | 11/2007 | Chamberlain et al. |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019182 A1 | 1/2008 | Yanagidaira et al. |
| 2008/0022163 A1 | 1/2008 | Tanaka et al. |
| 2008/0052446 A1 | 2/2008 | Lasser et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2009/0003058 A1 | 1/2009 | Kang |
| 2009/0037652 A1 | 2/2009 | Yu et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |

(56) References Cited

U.S. PATENT DOCUMENTS

| | | | |
|---|---|---|---|
| 2009/0172260 | A1 | 7/2009 | Olbrich et al. |
| 2009/0172261 | A1 | 7/2009 | Prins et al. |
| 2009/0172262 | A1 | 7/2009 | Olbrich et al. |
| 2009/0172308 | A1 | 7/2009 | Prins et al. |
| 2009/0172335 | A1 | 7/2009 | Kulkarni et al. |
| 2009/0172499 | A1 | 7/2009 | Olbrich et al. |
| 2009/0193058 | A1 | 7/2009 | Reid |
| 2009/0207660 | A1 | 8/2009 | Hwang et al. |
| 2009/0222708 | A1 | 9/2009 | Yamaga |
| 2009/0228761 | A1 | 9/2009 | Perlmutter et al. |
| 2009/0296466 | A1 | 12/2009 | Kim et al. |
| 2009/0296486 | A1 | 12/2009 | Kim et al. |
| 2009/0319864 | A1 | 12/2009 | Shrader |
| 2010/0061151 | A1 | 3/2010 | Miwa et al. |
| 2010/0103737 | A1 | 4/2010 | Park |
| 2010/0161936 | A1 | 6/2010 | Royer et al. |
| 2010/0199125 | A1 | 8/2010 | Reche |
| 2010/0202196 | A1 | 8/2010 | Lee et al. |
| 2010/0208521 | A1 | 8/2010 | Kim et al. |
| 2010/0262889 | A1 | 10/2010 | Bains |
| 2010/0281207 | A1 | 11/2010 | Miller et al. |
| 2010/0281342 | A1 | 11/2010 | Chang et al. |
| 2011/0083060 | A1 | 4/2011 | Sakurada et al. |
| 2011/0113281 | A1 | 5/2011 | Zhang et al. |
| 2011/0131444 | A1 | 6/2011 | Buch et al. |
| 2011/0173378 | A1 | 7/2011 | Filor et al. |
| 2011/0205823 | A1 | 8/2011 | Hemink et al. |
| 2011/0213920 | A1 | 9/2011 | Frost et al. |
| 2011/0228601 | A1 | 9/2011 | Olbrich et al. |
| 2011/0231600 | A1 | 9/2011 | Tanaka et al. |
| 2012/0096217 | A1 | 4/2012 | Son et al. |
| 2012/0110250 | A1 | 5/2012 | Sabbag et al. |
| 2012/0151253 | A1 | 6/2012 | Horn |
| 2012/0195126 | A1 | 8/2012 | Roohparvar |
| 2012/0239976 | A1 | 9/2012 | Cometti et al. |
| 2012/0284587 | A1 | 11/2012 | Yu et al. |
| 2013/0170297 | A1* | 7/2013 | Nam et al. ............... 365/185.09 |
| 2013/0242667 | A1* | 9/2013 | Shim et al. ............... 365/185.19 |
| 2014/0149641 | A1* | 5/2014 | Avila et al. .................... 711/103 |

FOREIGN PATENT DOCUMENTS

| | | |
|---|---|---|
| JP | 2002-532806 | 10/2002 |
| WO | WO 2007/036834 | 4/2007 |
| WO | WO 2007/080586 | 7/2007 |
| WO | WO 2008/121553 | 10/2008 |
| WO | WO 2008/121577 | 10/2008 |
| WO | WO 2009/028281 | 3/2009 |
| WO | WO 2009/032945 | 3/2009 |
| WO | WO 2009/058140 | 5/2009 |
| WO | WO 2009/084724 | 7/2009 |
| WO | WO 2009/134576 | 11/2009 |

OTHER PUBLICATIONS

Canim, Buffered Bloom ilters on Solid State Storage, ADMS*10, Singapore, Sep. 13-17, 2010, 8 pgs.
Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
McLean, Information Technology-AT Attachment with Packet Interface Extension, Aug. 19, 1998, 339 pgs.
Park et al., "A High Performance Controller for NAND Flash-Based Solid State Disk (NSSD)," Proceedings of Non-Volatile Semiconductor Memory Workshop, Feb. 2006, 4 pgs.
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
International Search Report and Written Opinion dated May 14, 2014, received in International Patent Application No. PCT/US2014/017168, which corresponds to U.S. Appl. No. 14/076,115, 6 pages (Fitzpatrick).
International Search Report and Written Opinion dated May 14, 2014, received in International Patent Application No. PCT/US2014/017169, which corresponds to U.S. Appl. No. 14/076,148, 6 pages (Fitzpatrick).
Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report /Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
SanDisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.

* cited by examiner

```
┌─────────────────────────────────────────────────────────────────┐
│                  While in the first configuration:              │──1106
│                              Ⓐ                                  │
│  ┌───────────────────────────────────────────────────────────┐  │
│  │    A first subset of the plurality of word lines corresponding to the │──1128
│  │ respective block, at a first subset of the vertical positions, is configured │
│  │ to store data at a first storage density, the first storage density │
│  │ corresponding to storage of B bits per memory cell, where the │
│  │ predefined number of bits is greater than zero; and       │  │
│  │                                                           │  │
│  │    A second subset of the plurality of word lines corresponding to │
│  │ the respective block, at a second subset of the vertical positions, is │
│  │ configured to store data at a second storage, the second storage │
│  │ density corresponding to storage of M bits per memory cell, where M │
│  │ is greater than zero and M is less than B                 │  │
│  └───────────────────────────────────────────────────────────┘  │
│                                                                 │
│  ┌───────────────────────────────────────────────────────────┐  │
│  │    A first subset of the plurality of word lines corresponding to the │──1130
│  │ respective block, at a first subset of the vertical positions, is configured │
│  │ to store data encoded with a first ECC encoding strength; and │
│  │                                                           │  │
│  │    A second subset of the plurality of word lines corresponding to │
│  │ the respective block, at a second subset of the vertical positions, is │
│  │ configured to store data encoded with a second ECC encoding │
│  │ strength greater than the first ECC encoding strength     │  │
│  └───────────────────────────────────────────────────────────┘  │
│                                                                 │
│  ┌───────────────────────────────────────────────────────────┐  │
│  │    A first subset of the plurality of word lines corresponding to the │──1132
│  │ respective block, at a first subset of the vertical positions, is configured │
│  │ to store data according to a first set of one or more programming │
│  │ parameters; and                                           │  │
│  │                                                           │  │
│  │    A second subset of the plurality of word lines corresponding to │
│  │ the respective block, at a second subset of the vertical positions, is │
│  │ configured to store data according to a second set of one or more │
│  │ programming parameters                                    │  │
│  │  ┌─────────────────────────────────────────────────────┐  │  │
│  │  │   The second set of one or more programming parameters │──1134
│  │  │   exposes memory cells in the second subset of the plurality of │
│  │  │   word lines corresponding to the respective block to a greater │
│  │  │   amount of stress than the first set of one or more programming │
│  │  │                       parameters                    │  │  │
│  │  └─────────────────────────────────────────────────────┘  │  │
│  └───────────────────────────────────────────────────────────┘  │
│                                                                 │
│  ┌───────────────────────────────────────────────────────────┐  │
│  │   The second subset of the vertical positions corresponding to the │──1136
│  │    second subset of the plurality of word lines corresponding to the │
│  │  respective block are closer to the substrate of the storage device than │
│  │    the first subset of the vertical positions corresponding to the first │
│  │   subset of the plurality of word lines corresponding to the respective │
│  │                              block                        │  │
│  └───────────────────────────────────────────────────────────┘  │
└─────────────────────────────────────────────────────────────────┘
```

Figure 11C

METHOD AND SYSTEM FOR DYNAMIC WORD LINE BASED CONFIGURATION OF A THREE-DIMENSIONAL MEMORY DEVICE

RELATED APPLICATIONS

This application claims priority to U.S. Provisional Patent Application No. 62/005,930, filed May 30, 2014, which is hereby incorporated by reference in its entirety.

This application is related to U.S. patent application Ser. No. 14/272,363, filed May 8, 2014, entitled "Three-Dimensional Memory Device Having Stacked Conductive Channels," U.S. patent application Ser. No. 14/272,951, filed May 8, 2014, entitled "Memory Access Technique for a Memory Having a Three-Dimensional Memory Configuration," U.S. patent application Ser. No. 14/273,005, filed May 8, 2014, entitled "Error Correcting Code Technique for a Memory Having a Three-Dimensional Memory Configuration," U.S. patent application Ser. No. 14/273,031, filed May 8, 2014, entitled "Structure Variation Detection for a Memory Having a Three-Dimensional Memory Configuration," and U.S. patent application Ser. No. 14/321,701, filed Jul. 1, 2014, entitled "Method and System for Recharacterizing the Storage Density of a Memory Device or a Portion Thereof," each of which is incorporated herein by reference in its entirety.

TECHNICAL FIELD

The disclosed embodiments relate generally to memory systems, and in particular, to improving the reliability with which a storage device (e.g., a three-dimensional (3D) memory device) retains data.

BACKGROUND

Non-volatile data storage devices have enabled increased portability of data and software applications. For example, multi-level cell (MLC) storage elements of a flash memory device may each store multiple bits of data, enhancing data storage density as compared to single-level cell (SLC) flash memory devices. Consequently, flash memory devices enable users to store and access a large amount of data. As a number of bits stored per cell increases, bit errors in stored data typically increase. A data storage device may encode and decode data using an error correcting code (ECC) technique to correct certain bit errors in data. The ECC technique may utilize parity information that decreases data storage capacity for other information, such as user data.

To further increase data storage capacity, advances in memory device technology have resulted in memory devices that have a three-dimensional (3D) configuration. For example, a 3D memory device includes a plurality of memory cells that are vertically stacked and positioned in different layers (e.g., different levels) of multiple vertically stacked layers. A group of memory cells that is vertically stacked may be coupled with a conductive channel. During manufacturing of the 3D memory device, a hole may be created through the multiple vertically stacked layers to enable formation of the conductive channel. However, as a number of layers that the hole extends through increases, controlling formation of the hole becomes difficult. For example, a shape of the hole may not be a cylindrical shape through all of the multiple layers; rather, the hole may have a tapered shape through one or more of the multiple layers. To illustrate, a cross-section of the hole through the multiple layers may have a conical shape or a funnel shape. When the hole does not have a consistent shape (e.g., a consistent diameter) through all of the multiple layers, physical dimensions of one or more memory cells may be affected which may result in reduced performance of those memory cells.

SUMMARY

In some embodiments, a memory controller is configured to perform operations with/on a storage device (e.g., a 3D memory device). In some embodiments, the memory controller dynamically adjusts one or more configuration parameters (e.g., ECC encoding strength, programming parameters, and/or storage density) associated with a respective word line of the storage device after detecting a trigger condition. The trigger condition is optionally based one or more status metrics for the respective word line (e.g., a count of program-erase (PE) cycles performed on the respective word line, a number of bytes written to the respective word line, and a bit error rate (BER) for data read from pages of the respective word line, or a combination thereof).

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIGS. 11A-11C illustrate a flowchart representation of a method of operation in a storage device with a 3D array of memory cells in accordance with some embodiments.

Figure 1:
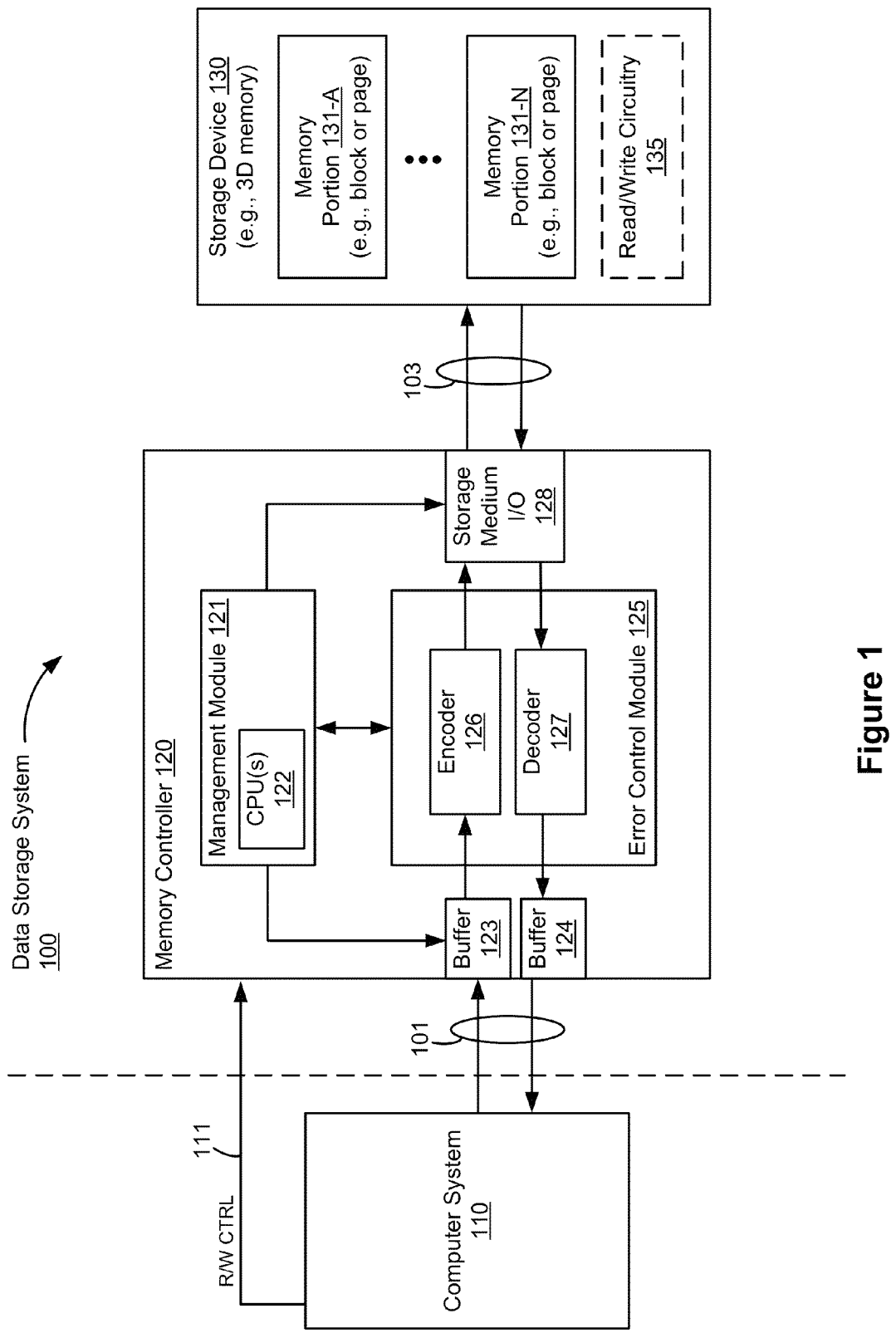
FIG. 1 is a block diagram illustrating an implementation of a data storage system in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, devices, and/or methods that may improve the reliability with which data can be retained by a storage device (e.g., a 3D memory device). Some implementations include systems, devices, and/or methods to dynamically adjust configuration parameters on a word line basis for a 3D memory device.

In some embodiments, a method of operation in a storage device that includes a three-dimensional array of memory cells, including multiple blocks of memory cells, each block including a plurality of word lines arranged in different vertical positions relative to a substrate of the storage device is performed by a memory controller (e.g., embedded in the storage device or separate from the storage device). For a respective block of the multiple blocks, the method includes: configuring the plurality of word lines corresponding to the respective block in a first configuration, where the first configuration includes a respective set of configuration parameters for each word line of the plurality of word lines determined at least in part on the vertical positions of each word line relative to the substrate of the storage device; and, while the plurality of word lines are configured in accordance with the first configuration, writing data to the respective block and reading data from the respective block. For the respective block, the method includes: in response to detecting a first trigger condition as to a respective word line of the plurality of word lines, adjusting a first parameter in the respective set of configuration parameters corresponding to the respective word line; and, after adjusting the first parameter in the respective set of configuration parameters corresponding to the respective word line, writing data to the respective word line and reading data from the respective word line.

Some embodiments include an electronic system or device (e.g., data storage system 100, FIG. 1 or memory controller 120, FIG. 1), comprising: one or more processors; and memory storing one or more programs to be executed by the one or more processors, the one or more programs comprising instructions for performing or controlling performance of any of the methods described herein. Some embodiments include a non-transitory computer readable storage medium, storing one or more programs for execution by one or more processors of an electronic system or device (e.g., data storage system 100, FIG. 1 or memory controller 120, FIG. 1), the one or more programs including instructions for performing or controlling performance of any of the methods described herein. Some embodiments include an electronic system or device (e.g., data storage system 100, FIG. 1 or memory controller 120, FIG. 1) comprising means for performing or controlling performance of the operations of any of the methods described herein.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a diagram of an implementation of a data storage system 100 in accordance with some embodiments. While some example features are illustrated, various other features have not been illustrated for the sake of brevity and so as not to obscure more pertinent aspects of the example embodiments disclosed herein. To that end, as a non-limiting example, data storage system 100 is used in conjunction with a computer system 110, where data storage system 100 includes a memory controller 120 and a storage device 130. In some embodiments, storage device 130 includes a single memory device (e.g., a volatile memory device or a non-volatile memory (NVM) device such as a magnetic disk storage device, an optical disk storage device, a flash memory device, a three-dimensional (3D) memory device (as further described herein), or another semiconductor NVM memory device). In some embodiments, storage device 130 includes a plurality of memory devices or is one of a plurality of memory devices coupled with memory controller 120. In some embodiments, a memory device includes one or more die, each with two or more individually addressable blocks (e.g., erase blocks). In some embodiments, storage device 130 includes NAND-type flash memory or NOR-type flash memory. Further, in some embodiments, memory controller 120 is a solid-state drive (SSD) controller. However, one or more other types of storage media may be included in accordance with aspects of a wide variety of embodiments.

Computer system 110 is coupled with memory controller 120 through data connections 101. However, in some embodiments, computer system 110 includes memory controller 120 as a component and/or a sub-system. Computer system 110 may be any suitable computing device, such as a desktop computer, a laptop computer, a tablet device, a netbook, an internet kiosk, a personal digital assistant, a mobile phone, a smart phone, a gaming device, a wearable computing device, a computer server, or any other computing device. Computer system 110 is sometimes called a host or host system. In some embodiments, computer system 110 includes one or more processors, one or more types of memory, a display, and/or other user interface components such as a keyboard, a touch screen display, a mouse, a trackpad, a digital camera, and/or any number of supplemental devices to add I/O functionality.

Storage device 130 is coupled with memory controller 120 through connections 103. Connections 103 are sometimes called data connections, but typically convey commands in addition to data, and optionally convey metadata, error correction information, and/or other information in addition to data values to be stored in storage device 130 and data values read from storage device 130. In some embodiments, however, memory controller 120 and storage device 130 are included in the same device as components thereof. Furthermore, in some implementations memory controller 120 and storage device 130 are embedded in a host device, such as a mobile device, tablet, other computer, or computer controlled device, and the methods described herein are performed by the embedded memory controller. Storage device 130 may include any number (i.e., one or more) of memory devices including, without limitation, non-volatile semiconductor memory devices, such as flash memory. For example, flash memory devices can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers.

In FIG. 1, storage device 130 (e.g., with one or more memory devices) includes a plurality of memory portions 131-A, ..., 131-N. For example, a respective memory portion is one of a plurality of memory devices in storage device 130, or a die, block (e.g., an individually addressable block such as an erase block), word line, or page associated with a respective memory device in storage device 130. In some embodiments, storage device 130 is divided into a number of individually addressable (and, thus, individually selectable) blocks. In some embodiments, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device. In some embodiments, storage device 130 includes read/write circuitry 135 for selecting a respective portion of storage device 130 on which to perform a memory operation (e.g., a read, write, or erase operation) and for causing performance of the memory operation on the respective portion of storage device 130.

For example, one block includes a number of pages (e.g., 64 pages, 128 pages, 256 pages, or another suitable number of pages). In some implementations, blocks in a die are grouped into a plurality of zones. Typically, each block zone of the die is in a physically distinct region of the due, such as a particular half or particular quadrant of the memory cell array in the die. In some implementations, each block zone is independently managed to some extent, which increases the degree of parallelism for parallel operations and simplifies management of storage device 130.

In some embodiments, memory controller 120 includes a management module 121, an input buffer 123, an output buffer 124, an error control module 125, and a storage medium interface (I/O) 128. In some embodiments, memory controller 120 includes various additional features that have not been illustrated for the sake of brevity and so as not to obscure more pertinent features of the example embodiments disclosed herein, and that a different arrangement of features may be possible. Input buffer 123 and output buffer 124 provide an interface to computer system 110 through data connections 101. Similarly, storage medium I/O 128 provides an interface to storage device 130 though connections 103. In some embodiments, storage medium I/O 128 includes read and write circuitry, including circuitry capable of providing reading signals to storage device 130 (e.g., reading threshold voltages for NAND-type flash memory).

In some embodiments, management module 121 includes one or more processing units (CPU(s), also sometimes called one or more processors) 122 configured to execute instructions in one or more programs (e.g., in management module 121). In some embodiments, one or more CPUs 122 are shared by one or more components within, and in some cases, beyond the function of memory controller 120. Management module 121 is coupled with input buffer 123, output buffer 124 (connection not shown), error control module 125, and storage medium I/O 128 in order to coordinate the operation of these components.

Error control module 125 is coupled with storage medium I/O 128, input buffer 123 and output buffer 124. Error control module 125 is provided to limit the number of uncorrectable errors inadvertently introduced into data. In some embodiments, error control module 125 is executed in software by one or more CPUs 122 of management module 121, and, in other embodiments, error control module 125 is implemented in whole or in part using special purpose circuitry to perform encoding and decoding functions. To that end, error control module 125 includes an encoder 126 and a decoder 127. In some embodiments, error control module 125 is configured to encode data (i.e., with encoder 126) and decode raw read data (i.e., with decoder 127) according to one of a plurality of ECC techniques (or ECC strengths), such as Reed-Solomon, turbo-code, Bose-Chaudhuri-Hocquenghem (BCH), low-density parity check (LDPC), or other error control codes, or a combination thereof.

Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage device 130 from computer system 110 (e.g., write data). The data held in input buffer 123 is made available to encoder 126, which encodes the data by applying an error control code to produce one or more codewords. The one or more codewords are made available to storage medium I/O 128, which transfers the one or more codewords to storage device 130 in a manner dependent on the type of storage medium being utilized. A read operation is initiated when computer system (host) 110 sends one or more host read commands on control line 111 to memory controller 120 requesting data from storage device 130. Memory controller 120 sends one or more read access commands to storage device 130, via storage medium I/O 128, to obtain raw read data in accordance with memory locations (addresses) specified by the one or more host read commands. Storage medium I/O 128 provides the raw read data (e.g., comprising one or more codewords) to decoder 127. Decoder 127 applies a decoding process to the encoded data to recover the data, and to correct errors in the recovered data within the error correcting capability of the error control code. If the decoding is successful, the decoded data is provided to output buffer 124, where the decoded data is made available to computer system 110. In some embodiments, if the decoding is not successful, memory controller 120 may resort to a number of remedial actions or provide an indication of an irresolvable error condition.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some implementations, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to a flash memory cells are gate voltages applied to the gates of the flash memory cells to determine whether the memory cells conduct current at that gate voltage. In some implementations, when a flash memory cell's transistor conducts current at a given reading threshold voltage, indicating that the cell voltage is less than the reading threshold voltage, the raw data value for that read operation is a "1" and otherwise the raw data value is a "0."

Figure 2A:
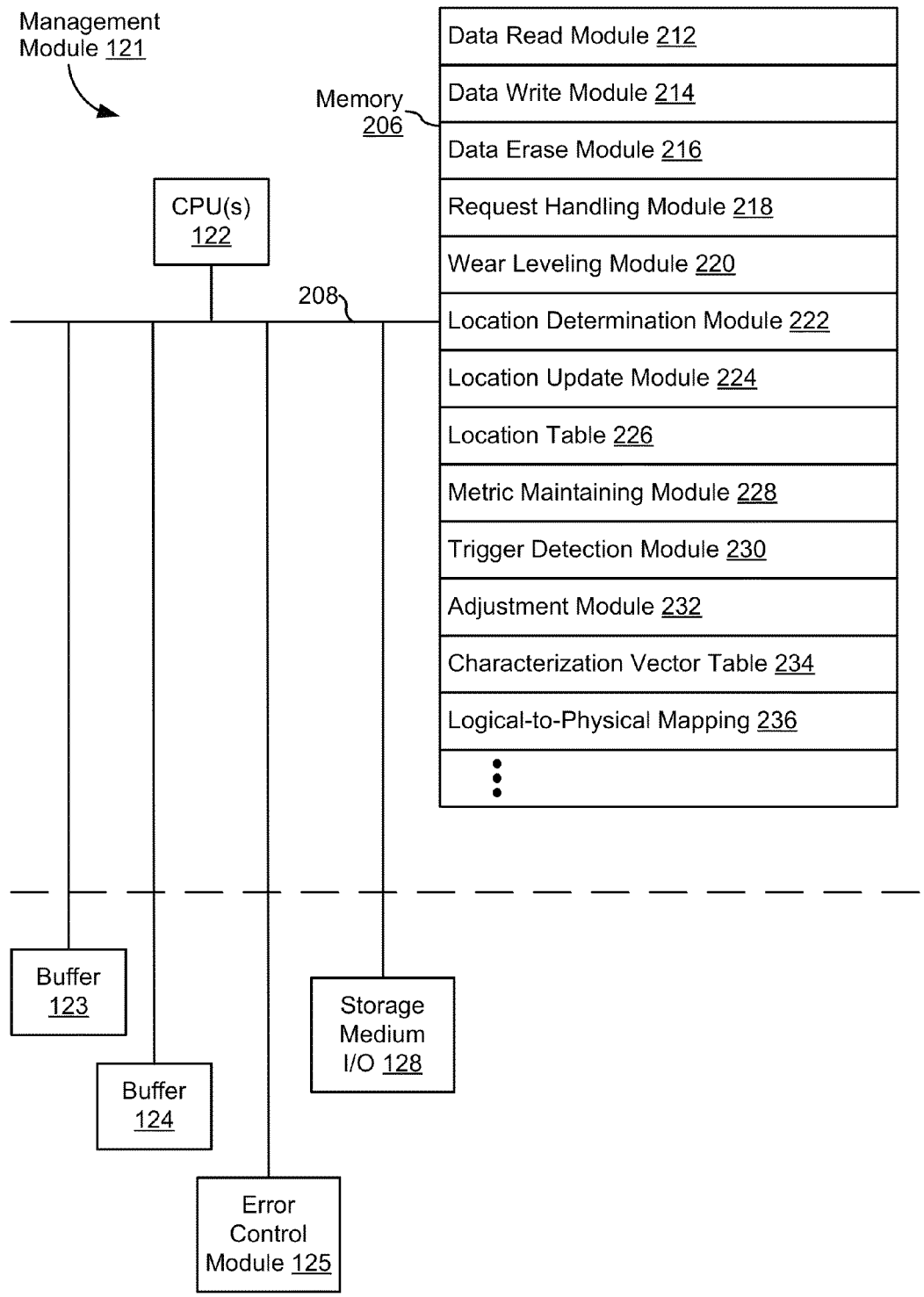
FIG. 2A is a block diagram illustrating an implementation of a management module in accordance with some embodiments.

FIG. 2A is a block diagram illustrating an exemplary management module 121, in accordance with some embodiments. Management module 121 typically includes one or more processing units 122 (also sometimes called CPU(s), processing unit(s), microprocessor(s), microcontroller(s), or core(s)) for executing modules, programs and/or instructions stored in memory 206 and thereby performing processing operations, memory 206, and one or more communication buses 208 for interconnecting these components. Communication buses 208 optionally include circuitry (sometimes called a chipset) that interconnects and controls communications between system components. Management module 121 is coupled with buffer 123, buffer 124, error control module 125, and storage device 130 by communication buses 208. Memory 206 includes volatile memory (e.g., one or more high-speed random access memory devices such as DRAM, SRAM, DDR RAM, or other random access solid state memory devices), and/or non-volatile memory (e.g., one or more NVM devices such as magnetic disk storage device(s), optical disk storage device(s), flash memory device(s), 3D memory device(s), or other non-volatile solid state storage device(s)). Memory 206 optionally includes one or more storage devices remotely located from one or more processing units 122. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset or superset thereof:

- data read module 212 for reading data, or causing data to be read, from storage device 130;
- data write module 214 for writing data, or causing data to be written, to storage device 130;
- data erase module 216 for erasing data, or causing data to be erased, from storage device 130;
- request handling module 218 for receiving memory operation commands from the host (e.g., computer system 110, FIG. 1) or other internal processes;
- wear leveling module 220 for optimally determining pages or blocks of storage device 130 for storing data so as to evenly wear the pages or blocks of storage device 130;
- (optionally) location determination module 222 for determining a variation location (e.g., the end of a taper region) for each column or block of storage device 130;
- (optionally) location update module 224 for determining an updated variation location for each column or block of storage device 130;
- (optionally) location table 226 storing the variation location determined by location determination module 222 and/or the updated variation location determined by location update module 224 for each column or block of storage device 130;
- metric maintaining module 228 for maintaining one or more status metrics for each memory portion of storage device 130 (e.g., die, block, word line, or page portion) or a combined status metric for each memory portion of storage device 130, where the combined status metric for a respective memory portion is computed based on a predefined algorithm that includes the one or more status metrics corresponding to the respective memory portion;
- trigger detection module 230 for detecting a trigger condition as to a respective portion of storage device 130;
- adjustment module 232 for adjusting one or more configuration parameters of the respective portion of storage device 130 in response to detecting the trigger condition as to the respective portion of storage device 130;
- characterization vector table 234 storing a collection of characterization vectors 235 that store characterization data for respective portions of storage device 130; and
- logical-to-physical mapping 236 storing a logical-to-physical map which maps logical addresses recognized by the host (e.g., computer system 110, FIG. 1) to physical addresses of storage device 130.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing any of the methods described below with reference to FIGS. 10 and 11A-11C.

Although FIG. 2A shows a management module 121, FIG. 2A is intended more as functional description of the various features which may be present in a management module than as a structural schematic of the embodiments described herein. In practice, and as recognized by those of ordinary skill in the art, items shown separately could be combined and some items could be separated.

Figure 2B:
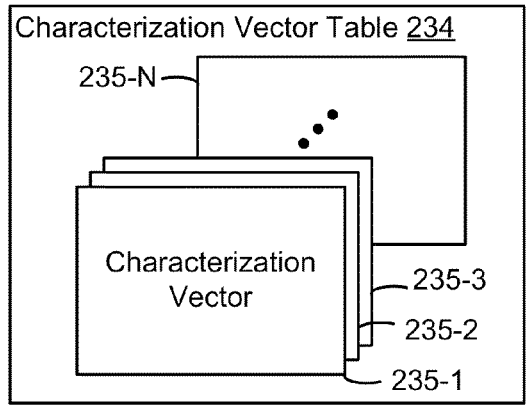
FIG. 2B is a diagram illustrating a characterization vector table included in FIG. 2A in accordance with some embodiments.

FIG. 2B is a block diagram illustrating an implementation of a characterization vector table 234 in accordance with some embodiments. Characterization vector table 234 includes a collection of characterization vectors 235, that each store characterization data associated with a respective portion of storage device 130 (e.g., a distinct die, block zone, block, word line, word line zone (e.g., a group of word lines at contiguous vertical positions relative to a substrate), or page portion of storage device 130). In some embodiments, each vector (e.g., vector 235-1, vector 235-2, . . . , vector 235-N) in the collection of characterization vectors 235 stores characterization data (e.g., bytes written 260, PE cycles 262, BER 264, and/or other usage information 266) derived during each of at least two time periods (e.g., time T-1 and time T-2, or X program-erase (PE) cycles and 2×PE cycles) for a respective portion of storage device 130. In some implementations, the characterization data stored in the characterization vectors 235 is statistically derived. For example, without limitation, in some embodiments in which storage device 130 (FIG. 1) includes multiple blocks, characterization vector table 234 includes at least one characterization vector for each distinct block of storage device 130. In another example, in some embodiments, characterization vector table 234 includes a set of distinct characterization vectors 235 for each block of storage device 130, and the set of distinct characterization vectors 235 for each die includes at least one distinct characterization vector for each word line or page in the block. In some embodiments, characterization vector table 234 has a set of predefined characterization vectors that are preprogrammed with configuration values appropriate for use with respective word lines at different stages of wear; at any one time, each word line or word line zone in the block is associated with one of the predefined characterization vectors. More detailed example implementations of characterization vectors 235 are described below with reference to FIG. 2C.

Figure 2C:
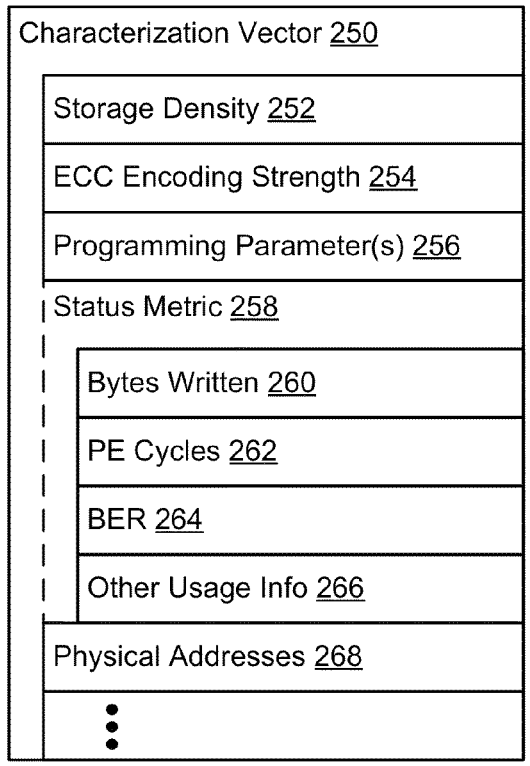
FIG. 2C is a diagram illustrating a representative characterization vector included in FIG. 2B in accordance with some embodiments.

FIG. 2C is a schematic diagram of an implementation of a representative characterization vector 250 (e.g., corresponding to any one of characterization vectors 235 shown in FIG. 2B) in accordance with some embodiments. In some embodiments, for a respective portion of storage device 130, characterization data stored in characterization vector 250 includes: (i) a storage density field 252 indicating the current storage density of memory cells in the respective portion of storage device 130 such as X3 (i.e., 3 bits per memory cell), X2 (i.e., 2 bits per memory cell), X1 (i.e., 1 bit per memory cell), or X0 (i.e., retired memory cells); (ii) an ECC encoding strength (and/or technique) field 254 indicating the current ECC encoding strength for data stored in page(s) associated with the respective portion of storage device 130 such as a number of parity bits and/or an ECC technique (e.g., Reed-Solomon, turbo, BCH, or LDPC codes); and (iii) a programming parameters field 256 indicating one or more programming parameters associated with the data stored, or to be stored, in the respective portion of storage device 130 such as a programming voltage, a number of programming pulses, and/or a step, width, or duration for each programming pulse.

In some embodiments, characterization data stored in characterization vector 250 includes one or more status metrics 258, non-limiting examples of which include: (a) a bytes written field 260 indicating a number of bytes of data written to the respective portion of storage device 130; (b) a PE cycle field 262 indicating a current count of the number of PE cycles performed on the respective portion of storage device 130; (c) a bit error rate (BER) field 264 indicating a number of errors included in a codeword read from a page of the respective portion of storage device 130 or an average number of errors included in the previous N codewords read from page(s) of the respective portion of storage device 130; and (d) other usage information 266 indicating the health, performance, and/or endurance of the respective portion of storage device 130.

In some embodiments, characterization data stored in characterization vector 250 optionally includes a combined status metric (represented by status metric 258 in FIG. 2C) for the respective portion of storage device 130. In some embodiments, the combined status metric is associated with the output of a predefined algorithm (e.g., computed by metric maintaining module 228, FIG. 2A) that takes into account one or more usage parameters associated with the respective portion of storage device 130. For example, the predefined algorithm incorporates one or more of: (a) a number of bytes written to the respective portion of storage device 130; (b) a number of PE cycles performed on the respective portion of storage device 130; (c) a BER for codewords read from page(s) of the respective portion of storage device 130; and (d) other usage information associated with the respective portion of storage device 130. In some embodiments, characterization data stored in characterization vector 250 includes a physical addresses field 268 for the respective portion of storage device 130 that indicates the physical addresses or set of physical addresses corresponding to the respective portion of storage device 130.

As discussed below with reference to FIG. 3A, a single-level flash memory cell (SLC) (sometimes also herein called "X1") stores one bit ("0" or "1"). Thus, the storage density of a SLC memory device is one bit of information per memory cell. A multi-level flash memory cell (MLC), however, can store two or more bits of information per cell by using different ranges within the total voltage range of the memory cell to represent a multi-bit bit-tuple. In turn, the storage density of a MLC memory device is multiple-bits per cell (e.g., two bits per memory cell).

Figure 3A:
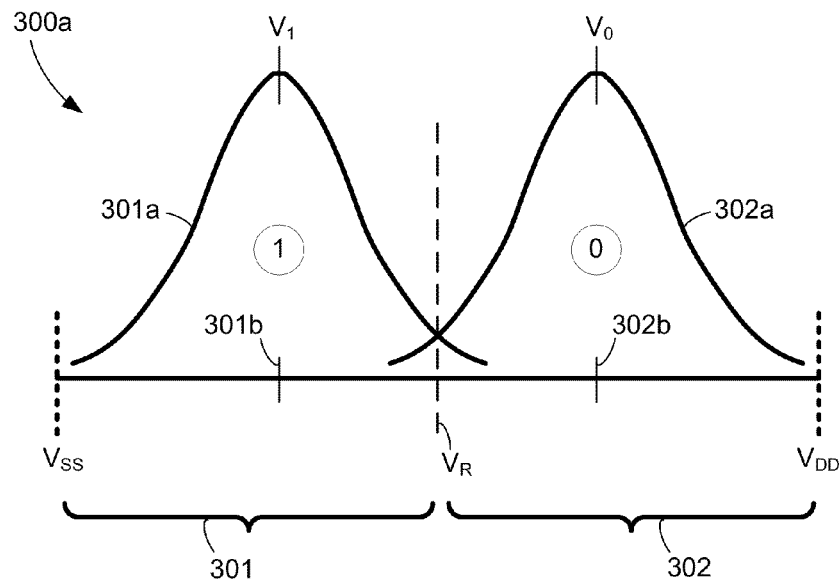
FIG. 3A is a prophetic diagram of voltage distributions found in a single-level flash memory cell (SLC) over time in accordance with some embodiments.

FIG. 3A is a simplified, prophetic diagram of voltage distributions 300a found in a single-level flash memory cell (SLC) in accordance with some embodiments. The voltage distributions 300a shown in FIG. 3A have been simplified for illustrative purposes. In this example, the SLC's voltage range extends approximately from a voltage, $V_{SS}$, at a source terminal of an NMOS transistor to a voltage, $V_{DD}$, at a drain terminal of the NMOS transistor. As such, voltage distributions 300a extend between $V_{SS}$ and $V_{DD}$.

Sequential voltage ranges 301 and 302 between source voltage $V_{SS}$ and drain voltage $V_{DD}$ are used to represent corresponding bit values "1" and "0," respectively. Each voltage range 301, 302 has a respective center voltage $V_1$ 301b, $V_0$ 302b. As described above, in many circumstances the memory cell current sensed in response to an applied reading threshold voltages is indicative of a memory cell voltage different from the respective center voltage $V_1$ 301b or $V_0$ 302b corresponding to the respective bit value written into the memory cell. Errors in cell voltage, and/or the cell voltage sensed when reading the memory cell, can occur during write operations, read operations, or due to "drift" of the cell voltage between the time data is written to the memory cell and the time a read operation is performed to read the data stored in the memory cell. For ease of discussion, these effects are collectively described as "cell voltage drift." Each voltage range 301, 302 also has a respective voltage distribution 301a, 302a that may occur as a result of any number of a combination of error-inducing factors, examples of which are identified above.

In some implementations, a reading threshold voltage $V_R$ is applied between adjacent center voltages (e.g., applied proximate to the halfway region between adjacent center voltages $V_1$ 301b and $V_0$ 302b). Optionally, in some implementations, the reading threshold voltage is located between voltage ranges 301 and 302. In some implementations, reading threshold voltage $V_R$ is applied in the region proximate to where the voltage distributions 301a and 302a overlap, which is not necessarily proximate to the halfway region between adjacent center voltages $V_1$ 301b and $V_0$ 302b.

In order to increase storage density in flash memory, flash memory has developed from single-level (SLC) cell flash memory to multi-level cell (MLC) flash memory so that two or more bits can be stored by each memory cell (sometimes also herein called "X2"). As discussed below with reference to FIG. 3B, an MLC flash memory device is used to store multiple bits by using voltage ranges within the total voltage range of the memory cell to represent different bit-tuples. An MLC flash memory device is typically more error-prone than a SLC flash memory device created using the same manufacturing process because the effective voltage difference between the voltages used to store different data values is smaller for an MLC flash memory device. Moreover, due to any number of a combination of factors, such as electrical fluctuations, defects in the storage medium, operating conditions, device history, and/or write-read circuitry, a typical error includes a stored voltage level in a particular MLC being in a voltage range that is adjacent to the voltage range that would otherwise be representative of the correct storage of a particular bit-tuple. As discussed in greater detail below, the impact of such errors can be reduced by gray-coding the data, such that adjacent voltage ranges represent single-bit changes between bit-tuples.

Figure 3B:
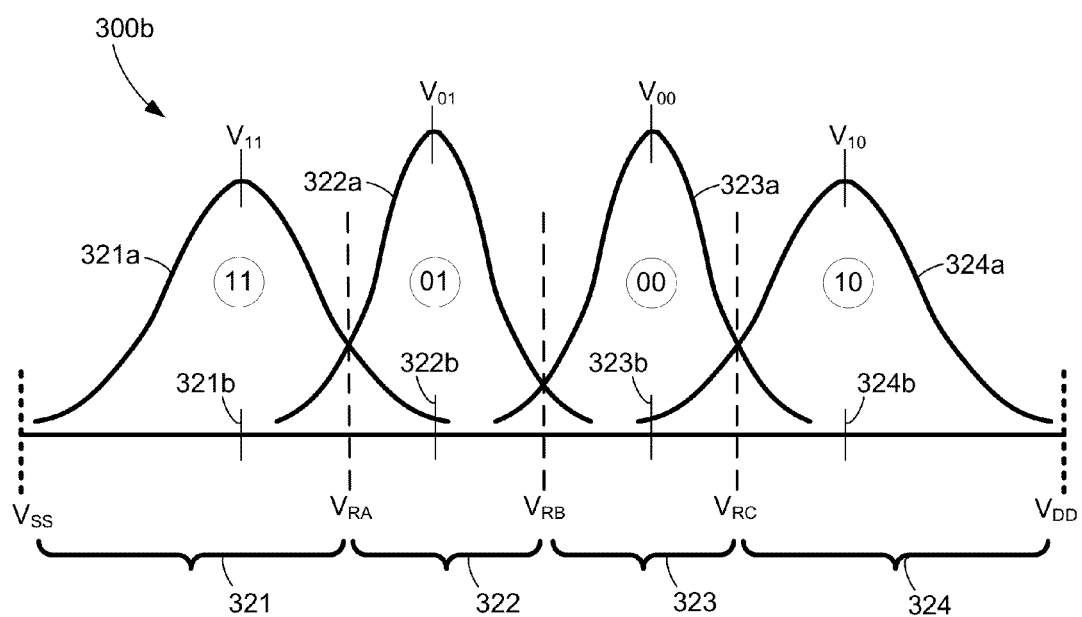
FIG. 3B is a prophetic diagram of voltage distributions found in a multi-level flash memory cell (MLC) over time in accordance with some embodiments.

FIG. 3B is a simplified, prophetic diagram of voltage distributions 300*b* found in a multi-level flash memory cell (MLC) over time in accordance with some embodiments. The voltage distributions 300*b* shown in FIG. 3B have been simplified for illustrative purposes. The cell voltage of an MLC approximately extends from a voltage, $V_{SS}$, at the source terminal of a NMOS transistor to a voltage, $V_{DD}$, at the drain terminal. As such, voltage distributions 300*b* extend between $V_{SS}$ and $V_{DD}$.

Sequential voltage ranges 321, 322, 323, 324 between the source voltage $V_{SS}$ and drain voltages $V_{DD}$ are used to represent corresponding bit-tuples "11," "01," "00," "10," respectively. Each voltage range 321, 322, 323, 324 has a respective center voltage 321*b*, 322*b*, 323*b*, 324*b*. Each voltage range 321, 322, 323, 324 also has a respective voltage distribution 321*a*, 322*a*, 323*a*, 324*a* that may occur as a result of any number of a combination of factors, such as electrical fluctuations, defects in the storage medium, operating conditions, device history (e.g., a number of PE cycles), and/or imperfect performance or design of write-read circuitry.

Ideally, during a write operation, the charge on the floating gate of the MLC would be set such that the resultant cell voltage is at the center of one of the ranges 321, 322, 323, 324 in order to write the corresponding bit-tuple to the MLC. Specifically, the resultant cell voltage would be set to one of $V_{11}$ 321*b*, $V_{01}$ 322*b*, $V_{00}$ 323*b*, and $V_{10}$ 324*b* in order to write a corresponding one of the bit-tuples "11," "01," "00," and "10." In reality, due to the factors mentioned above, the initial cell voltage may differ from the center voltage for the data written to the MLC.

Reading threshold voltages $V_{RA}$, $V_{RB}$, and $V_{RC}$ are positioned between adjacent center voltages (e.g., positioned at or near the halfway point between adjacent center voltages) and, thus, define threshold voltages between the voltage ranges 321, 322, 323, 324. During a read operation, one of the reading threshold voltages $V_{RA}$, $V_{RB}$, and $V_{RC}$ is applied to determine the cell voltage using a comparison process. However, due to the various factors discussed above, the actual cell voltage, and/or the cell voltage received when reading the MLC, may be different from the respective center voltage $V_{11}$ 321*b*, $V_{01}$ 322*b*, $V_{00}$ 323*b*, or $V_{10}$ 324*b* corresponding to the data value written into the cell. For example, the actual cell voltage may be in an altogether different voltage range, which strongly indicates that the MLC is storing a different bit-tuple than was written to the MLC. More commonly, the actual cell voltage may be close to one of the read comparison voltages, making it difficult to determine with certainty which of two adjacent bit-tuples is stored by the MLC.

Errors in cell voltage, and/or the cell voltage received when reading the MLC, can occur during write operations, read operations, or due to "drift" of the cell voltage between the time data is written to the MLC and the time a read operation is performed to read the data stored in the MLC. For ease of discussion, sometimes errors in cell voltage, and/or the cell voltage received when reading the MLC, are collectively called "cell voltage drift."

One way to reduce the impact of a cell voltage drifting from one voltage range to an adjacent voltage range is to gray-code the bit-tuples. Gray-coding the bit-tuples includes constraining the assignment of bit-tuples such that a respective bit-tuple of a particular voltage range is different from a respective bit-tuple of an adjacent voltage range by only one bit. For example, as shown in FIG. 3B, the corresponding bit-tuples for adjacent ranges 321 and 322 are respectively "11" and "01," the corresponding bit-tuples for adjacent ranges 322 and 323 are respectively "01" and "00," and the corresponding bit-tuples for adjacent ranges 323 and 324 are respectively "00" and "10." Using gray-coding, if the cell voltage drifts close to a read comparison voltage level, the error is typically limited to a single bit within the 2-bit bit-tuple.

One of ordinary skill in the art will appreciate how to apply the above discussion of 1-bit SLC and 2-bit MLC to N-bit memory cells. Sometimes herein, a memory cell configured to store 1 bit is referred to as X1, a memory cell configured to store 2 bits is referred to as X2, and a memory cell configured to store 3 bits is referred to as X3. Additionally, a retired memory cell, which is not available for further programming, is referred to as X0.

Figure 4A:
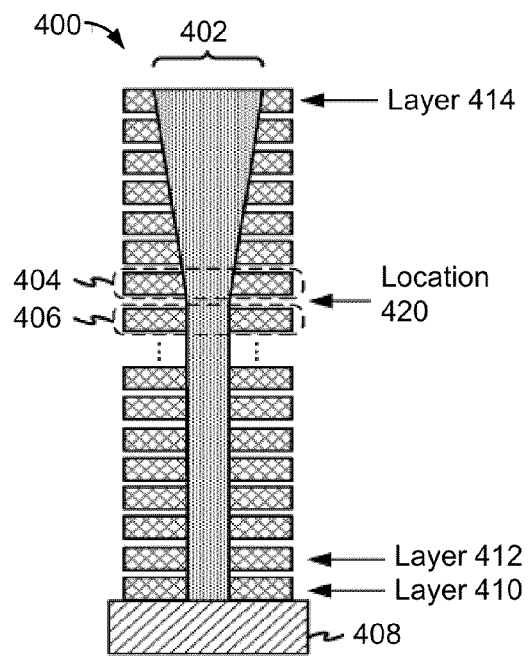
FIG. 4A is a schematic diagram of a column of a three-dimensional (3D) memory device in accordance with some embodiments.

FIG. 4A is a schematic diagram of a column 400 of a memory device (e.g., storage device 130, FIG. 1) in accordance with some embodiments. Column 400 is integrated within a memory device having a three-dimensional (3D) memory configuration. For example, column 400 is integrated within the storage device 130 of FIG. 1.

In some embodiments, column 400 includes storage elements (e.g., SLC or MLC flash memory cells) formed within multiple layers of materials that are formed on a substrate 408 (e.g., a silicon substrate). To illustrate, FIG. 4A shows representative layers 410, 412, and 414. For example, layer 410 is formed adjacent to substrate 408 (i.e., layer 410 is a "bottom" layer). Further in this example, layer 412 is adjacent to layer 410, and layer 414 is farther from the substrate than other layers of column 400 (i.e., layer 414 is a "top" layer). In some embodiments, layers 410, 412, and 414 include a conductive (or semiconductive) material (e.g., doped polysilicon). In some embodiments, column 400 includes other layers, such as an oxide layer interposed between layers 410 and 412.

In some embodiments, column 400 further includes a structure 402. To form structure 402, an etch process is performed to etch through layers of column 400 to form an etched region (e.g., a cavity, such as a "memory hole"). After etching through layers of column 400 to form the etched region, the etched region is filled with one or more materials to form structure 402. For example, structure 402 has a circular or substantially circular shape. In this example, a cross section of structure 402 that is perpendicular to a surface of substrate 408 is circular.

In some embodiments, column 400 includes multiple storage elements, such as representative storage elements 404 and 406 (e.g., SLC or MLC flash memory cells). For example, storage element 404 is included in a first physical page of a first word line of storage device 130 in FIG. 1, and the storage element 406 is included in a second physical page of a second word line of storage device 130 in FIG. 1. Storage elements 404 and 406 are connected to structure 402.

In some embodiments, structure 402 has a variation. For example, as illustrated in FIG. 4A, structure 402 has a "conical" or "tapered" profile. Location 420 indicates a region of structure 402 associated with tapering of structure 402. For example, in FIG. 4A, structure 402 is not tapered below location 420 (i.e., nearer to substrate 408 than location 420), and structure 402 is tapered above location 420 (i.e., farther from substrate 408 than location 420). In FIG. 4A, for example, location 420 is between storage elements 404 and 406 because structure 402 begins "tapering" approximately between storage elements 404 and 406.

By identifying location 420, accuracy of operations at storage device 130 can be improved. For example, by identifying location 420, storage elements 404 and 406 may be associated with different ECC parameters and/or different memory access parameters to compensate for differences in physical characteristics of storage elements 404 and 406 due to tapering of structure 402. Differences in physical characteristics of storage elements are described further with reference to FIG. 4B.

Figure 4B:
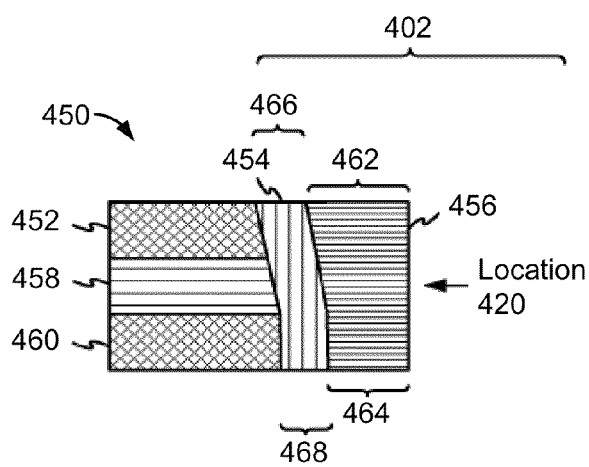
FIG. 4B is a schematic diagram of a portion of the column in FIG. 4A in accordance with some embodiments.

FIG. 4B is a schematic diagram of a portion 450 of column 400 in accordance with some embodiments. In accordance with some embodiments, portion 450 illustrates a charge trap structure 454 and a conductive channel 456 formed within structure 402. In FIG. 4B, control gate 452 and a control gate 460 are connected to charge trap structure 454. For example, control gate 452 is included in storage element 404 of FIG. 4A, and control gate 460 is included in storage element 406 of FIG. 4A. In some embodiments, control gates 452 and 460 are separated by a material, such as an oxide region 458.

In some embodiments, control gates 452 and 460 and oxide region 458 are formed within multiple layers of storage device 130. For example, control gate 452 is formed within a polysilicon layer, oxide region 458 is formed within an oxide layer, and control gate 460 is formed within another polysilicon layer. In some embodiments, control gates 452 and 460 and oxide region 458 are formed within one or more "physical layers" of storage device 130. For example, a physical layer includes control gate 452 and oxide region 458.

It should be appreciated that one or more additional materials may be formed within structure 402. For example, charge trap structure 454 is separated from control gate 452 and conductive channel 456 by a gate dielectric, such as a silicon oxide. In some embodiments, charge trap structure 454 includes an insulating material, such as silicon nitride. In some embodiments, conductive channel 456 includes a conductive material, such as a metal (e.g., copper).

In some embodiments, portion 450 is biased to write a value to storage element 404 and to sense a value stored at storage element 404. In some embodiments, portion 450 is biased to write a value to storage element 406 and to sense a value stored at storage element 406. For example, charge is injected into or drained from charge trap structure 454 by biasing control gate 452 relative to conductive channel 456. In this example, the amount of charge in charge trap structure 454 affects the amount of current through conductive channel 456 during a read operation of storage element 404 and indicates one or more bit values stored in storage element 404. As another example, charge is injected into or drained from charge trap structure 454 by biasing control gate 460 relative to conductive channel 456. In this example, the amount of charge in charge trap structure 454 affects the amount of current through conductive channel 456 during a read operation of storage element 406 and indicates a state of storage element 406. The state of storage element 406 corresponds to one or more bit values stored by storage element 406.

FIG. 4B illustrates a variation (or "tapering") associated with structure 402. The variation corresponds to a difference between a first width of structure 402 at a first distance from substrate 408 and a second width of structure 402 at a second distance from substrate 408, where the second distance is greater than the first distance. To further illustrate, FIG. 4B illustrates that a variation associated with structure 402 affects channel width 462 (e.g., a radius of the channel) that is associated with control gate 452. FIG. 4B further shows that channel width 464 (e.g., a radius of the channel) associated with control gate 460 may be less than channel width 462 due to tapering of structure 402. Because channel width 464 is greater than channel width 462, operation of storage element 404 (FIG. 4A) may differ from operation of the storage element 406 (FIG. 4A). For example, because the width of conductive channel 456 affects the amount of current conducted by structure 402, the difference between channel widths 462 and 464 affects operation of a memory device that includes portion 450. Accordingly, biasing control gate 452 with a voltage causes conductive channel 456 to conduct less current as compared to applying voltage to control gate 460.

Alternatively or additionally, in accordance with some embodiments, a variation of structure 402 causes gate-to-channel distance 466 associated with storage element 404 to be greater than gate-to-channel distance 468 associated with storage element 406. In this case, charge trap structure 454 has a greater taper effect than conductive channel 456. During a write operation that programs a state of storage element 404, a greater voltage (relative to storage element 406) is applied to control gate 452 to accumulate charge within charge trap structure 454 (e.g., by drawing electrons from conductive channel 456 to within charge trap structure 454). Therefore, tapering of structure 402 causes programming operations of storage element 404 to differ relative to storage element 406, which results in an "incorrect" state being programmed to and/or sensed from storage element 404.

FIG. 4B illustrates that a variation (e.g., tapering) of a structure (e.g., the structure 402) extending through multiple layers of a memory device (e.g., storage device 130, FIG. 1) affects read and write operations associated with the memory device. In some embodiments, performance of a memory device that includes portion 450 is improved by using different ECC strengths (or techniques) and/or memory access techniques (e.g., programming parameters) for storage elements 404 and 406. For example, because a variation of structure 402 occurs at location 420, a first ECC technique and/or a first memory access technique is associated with storage element 406, and a second ECC technique and/or a second memory access technique is associated with storage element 404 to improve operation of the memory device (e.g., storage device 130, FIG. 1). For example, the second ECC technique compensates for a greater number of errors occurring at storage element 404 as compared to storage element 406 due to "tapering" of structure 402. For example, the second ECC technique has a higher error correction capability than the first ECC technique, which may improve error correction. For example, the second memory access technique compensates for a greater number of write errors and/or read errors that may occur at storage element 404 as compared to storage element 406 due to "tapering" of structure 402. For example, second memory access technique programs storage element 404 using a different programming voltage (as compared to first memory access technique) in order to program storage element 404 to the "correct" state. As another example, second memory access technique senses storage element 404 using a different read voltage (as compared to the first memory access technique) in order to read storage element 404 at the "correct" threshold voltage (e.g., to compensate for reduced effectiveness of programming operations at storage element 404 caused by tapering of structure 402). As described further herein ECC techniques and/or memory access techniques can be selectively applied to physical pages of a block based on a location of a variation of structure 402.

Figure 5:
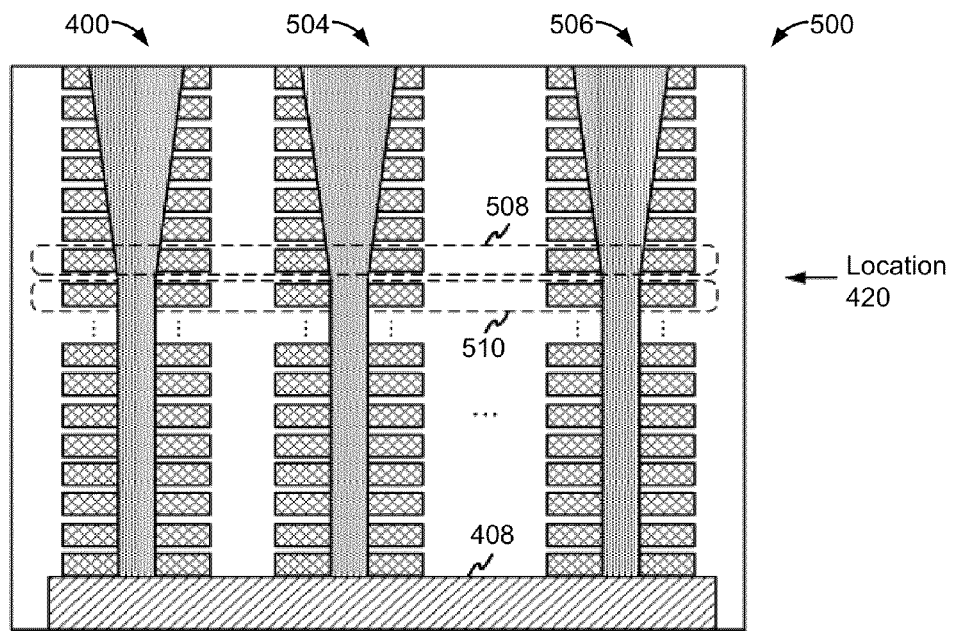
FIG. 5 is a schematic diagram of a block of a 3D memory device in accordance with some embodiments.

FIG. 5 is a schematic diagram of a block 500 (e.g., an erase block of storage elements) in accordance with some embodiments. For example, block 500 is included in the storage device 130 in FIG. 1. In FIG. 5, block 500 includes at least includes physical pages 508 and 510 and further includes column 400 from FIG. 4A.

In FIG. 5, block 500 includes columns 504 and 506 in addition to column 400. In FIG. 5, columns 400, 504, and 506 are formed upon substrate 408. Columns 400, 504, and 506 includes a plurality of physical pages (e.g., word lines of storage elements) formed within the plurality of layers of storage device 130 (FIG. 1). For example, physical pages 508 and 510 are formed within the layers of block 500. Each physical page of the block 500 includes multiple storage elements. As an example, storage element 404 of FIG. 4A is formed within physical page 508, and storage element 406 of FIG. 4A is formed within physical page 510.

In FIG. 5, a variation (e.g., tapering) occurs in the structure of each of columns 400, 504, and 506. It should be appreciated that, depending on the particular fabrication process, a block may include one or more columns with structures that do not include (or that do not substantially include) a variation. In FIG. 5, the variation within each of columns 400, 504, and 506 occurs at (or approximately at) location 420. In some embodiments, it should be appreciated that variations within each of columns 400, 504, and 506 occur at different locations (e.g., at different heights above the substrate 408).

FIG. 5 illustrates that a location (e.g., location 420) of a variation of a structure may occur between (or approximately between) physical pages of a block (e.g., block 500). In some embodiments, memory controller 120 applies techniques for encoding, writing, reading, and decoding data from a physical page of block 500 based on a location of the physical page relative to location 420. As described further with reference to FIG. 6, in some embodiments, location 420 defines multiple levels (or groups of layers) of a three-dimensional (3D) memory.

Figure 6:
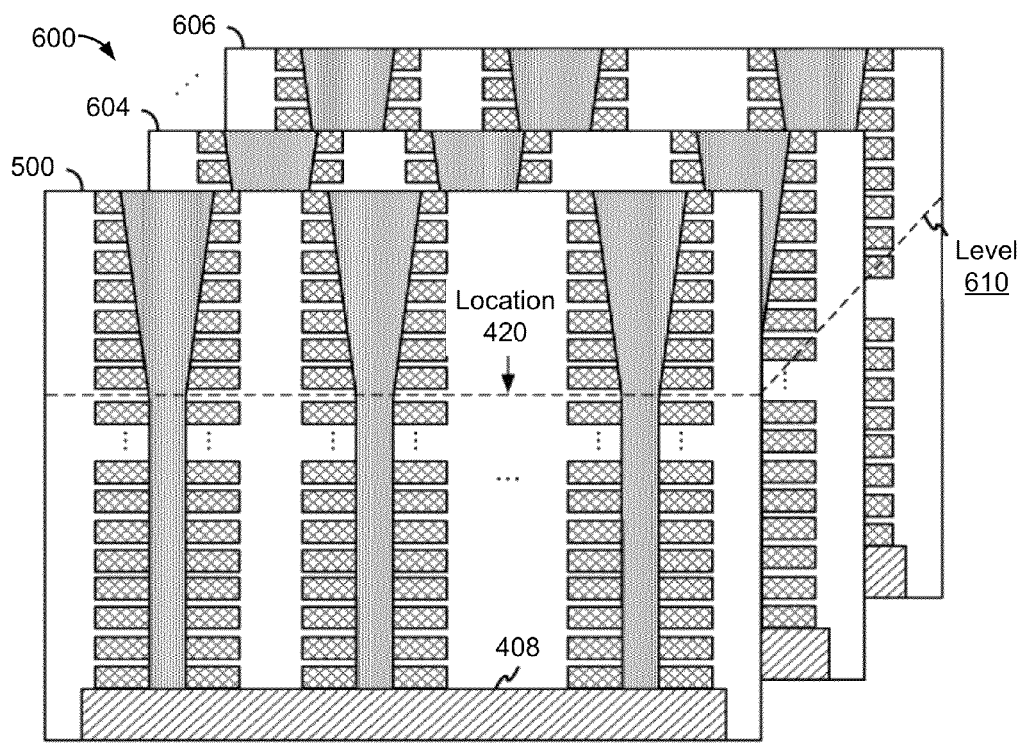
FIG. 6 is a schematic diagram of a 3D memory device in accordance with some embodiments.

FIG. 6 is a schematic diagram of a three-dimensional (3D) memory device 600 in accordance with some embodiments. For example, 3D memory device 600 is included in storage device 130 (FIG. 1). In FIG. 6, 3D memory device 600 includes block 500 of FIG. 5 and further includes blocks 604 and 606. In some embodiments, each of the blocks 500, 604, and 606 are formed upon substrate 408.

In FIG. 6, location 420 defines a level 610. In accordance with some embodiments, level 610 "partitions" 3D memory device 600 into multiple levels (e.g., a "bottom" level that is adjacent to substrate 408 and a "top" level that is non-adjacent to substrate 408). For example, level 610 defines a plane that intersects each of blocks 500, 604, and 606 at a level k, where k is a positive integer indicating a distance between substrate 408 and location 420. In some embodiments, level k indicates a number of physical pages or a number of word lines of 3D memory device 600 between substrate 408 and location 420.

In some embodiments, level 610 intersects each of blocks 500, 604, and 606 at a common level k. Alternatively, in some embodiments, depending on the particular fabrication process used to fabricate 3D memory device 600, level 610 intersects two or more of blocks 500, 604, and 606 at different locations. As an example, level 610 intersects block 500 at a first distance from substrate 408, intersects block 604 at a second distance from substrate 408, and intersects block 606 at a third distance from substrate 408. In this example, level 610 corresponds to a "non-uniform" plane, such as an inclined plane.

In some embodiments, memory controller 120 or a component thereof (e.g., location determination module 222, FIG. 2A) determines a variation location (e.g., the end of a taper region such as location 420 in FIGS. 4A-4B and 5-6) for each column or block of storage device 130 and stores the resulting locations in location table 226. For example, with reference to FIG. 4A, location determination module 222 determines location 420 for column 400 by comparing programming parameters required to program a same state to memory elements (or memory cells) in different word lines with different vertical positions relative to the substrate of storage device 130 (e.g., memory elements 404 and 406) during a setup or testing process. For example, a first page included in a first word line that require more intense programming parameters (e.g., programming voltage, number of programming pulses, and/or duration of programming pulses) to program memory cells in the first page with a respective state as compared to the programming parameters required to program memory cells of a second page in a second word line with the same respective state. Continuing with this example, location determination module 222 may determine that the variation location is located between the first and second word lines due to the tapering effect of the memory device causing the difference in programming parameters required to program the same respective state. For further discussion of determining the variation location, see U.S. patent application Ser. No. 14/273,031, filed May 8, 2014, entitled "Structure Variation Detection for a Memory Having a Three-Dimensional Memory Configuration," which is incorporated herein by reference in its entirety.

In some embodiments, location determination module 222 determines the variation location for each column or block of storage device 130 upon the first power-on of storage device 130. In some embodiments, memory controller 120 or a component thereof (e.g., location update module 224, FIG. 2A) determines an updated variation location for each column or block of storage device 130 and overwrites the previous locations in location table 226 with the resulting updated locations. For example, location update module 224 determines updated variation locations for each column or block of storage device 130 in accordance with a predefined schedule such as every X power cycles of storage device 130.

In some embodiments, location table 226 stores a determined location 420 for each block of storage device 130 indicating the end of a taper region for columns within a respective block. For example, for the respective block, determined location 420 indicates a page or word line at which the taper region ends relative to the substrate. In some embodiments, location table 226 stores a determined location 420 for each column of storage device 130 indicating the end of a taper region for a respective column. For example, for the respective column, determined location 420 indicates a page or word line at which the taper region ends relative to the substrate. As such, in some embodiments, memory controller 120 is able to selectively encode, write, read, and/or decode data from pages or word lines above and below determined location 420 for the respective column. For example, for the respective column, data written to pages or word lines above determined location 420 are encoded with a first ECC technique, and data written to pages or word lines below determined location 420 are encoded with a second ECC technique.

Figure 7:
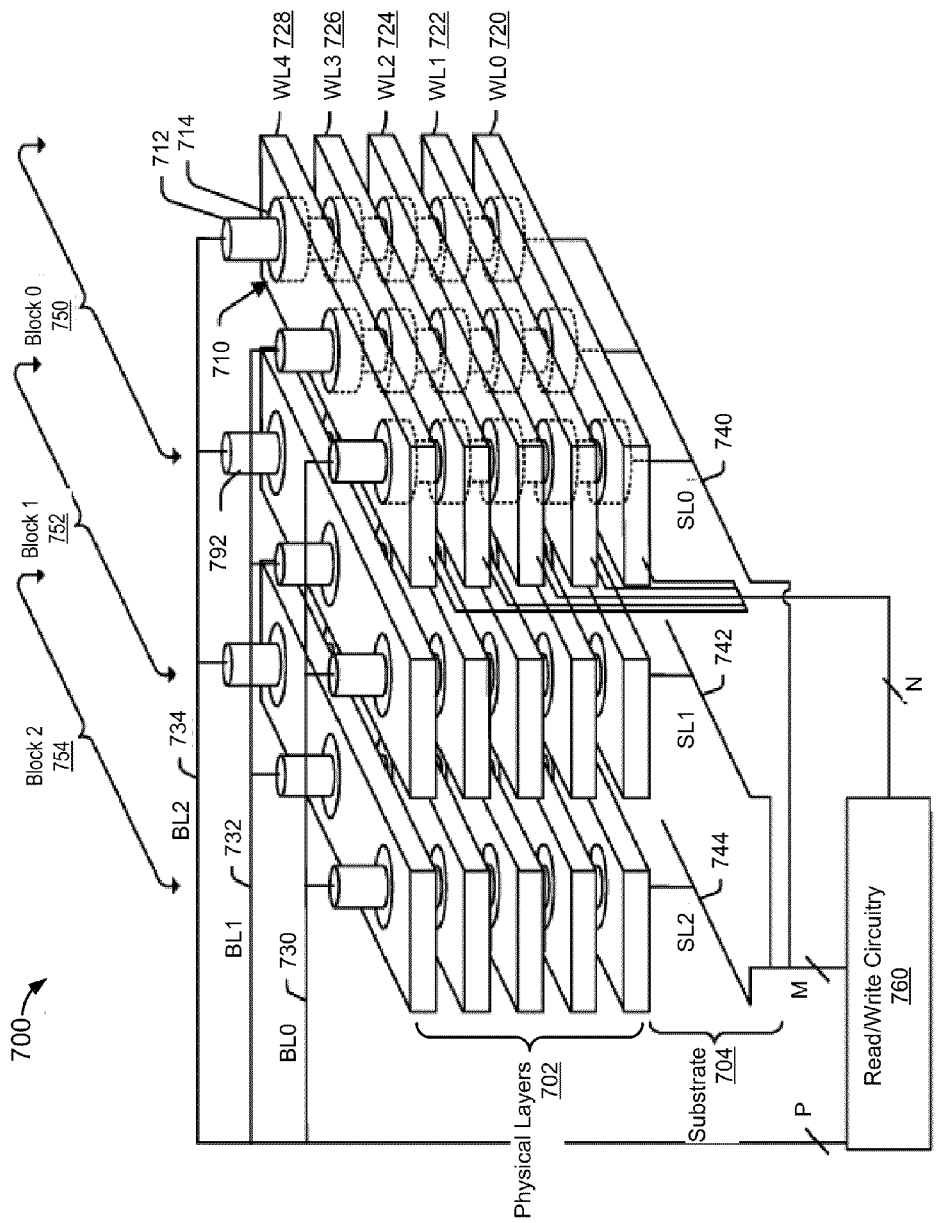
FIG. 7 is a schematic diagram of a 3D memory device in a NAND flash configuration in accordance with some embodiments.

FIG. 7 is a schematic diagram of a 3D memory device 700 in a NAND flash configuration in accordance with some embodiments. For example, 3D memory device 700 corresponds to storage device 130 (FIG. 1). In FIG. 7, 3D memory device 700 includes a plurality of physical layers 702, each with a plurality of storage elements (e.g., memory cells), such as a representative memory cell 710. In some embodiments, the storage elements are arranged in arrays within physical layers 702.

In FIG. 7, representative memory cell 710 includes a charge trap structure 714 between word line/control gate (WL4) 728 and conductive channel 712. Charge is injected into or drained from charge trap structure 714 by biasing conductive channel 712 relative to word line 728. For example, charge trap structure 714 includes silicon nitride and is separated from word line 728 and conductive channel 712 by a gate dielectric (e.g., silicon oxide). In some embodiments, the amount of charge in charge trap structure 714 affects the amount of current through conductive channel 712 during a read operation of memory cell 710 and indicates one or more bit values that are stored in memory cell 710.

In some embodiments, 3D memory device 700 includes multiple erase blocks, including a first block (block 0) 750, a second block (block 1) 752, and a third block (block 2) 754. In FIG. 7, block 750-754 each include a "vertical slice" of physical layers 702 that includes a stack of word lines, illustrated as a first word line (WL0) 720, a second word line (WL1) 722, a third word line (WL2) 724, a fourth word line (WL3) 726, and fifth word line (WL4) 728. Multiple conductive channels (having a substantially vertical orientation with respect to FIG. 7) extend through the stack of word lines. Each conductive channel is coupled with a storage element in each of word lines 720-728, forming a NAND string of storage elements. FIG. 7 illustrates three blocks 750-754, five word lines 720-728 in each block, and three conductive channels in each block for clarity of illustration. However, in some embodiments, 3D memory device 700 includes more than three blocks, more than five word lines per block, and more than three conductive channels per block.

In some embodiments, read/write circuitry 760 (i.e., read/write circuitry 135 or alternatively read/write circuitry within storage medium I/O 128) is coupled with conductive channels via multiple conductive lines, illustrated as a first bit line (BL0) 730, a second bit line (BL1) 732, and a third bit line (BL2) 734 at a "top" end of the conducive channels (e.g., relative to substrate 704) and a first source line (SL0) 740, a second source line (SL1) 742, and a third source line (SL2) 744) at a "bottom" end of the conductive channels (e.g., relative to substrate 704). In FIG. 7, read/write circuitry 760 is coupled with bit lines 730-734 via "P" control lines, coupled with source lines 740-744 via "M" control lines, and coupled with word lines 720-728 via "N" control lines. In some embodiments, each of P, M, and N are a positive integer value based on the specific configuration of 3D memory device 700. In FIG. 7, P=3, M=3, and N=5.

In some embodiments, each of bit lines 730-734 and each of source lines 740-744 are coupled with the same end (e.g., the top end or the bottom end) of different conductive channels. For example, a respective bit line is coupled with the top of conductive channel 792 and a respective source line is coupled with the top of conductive channel 712. Continuing with this example, the bottom of conductive channel 792 is coupled (e.g., electrically coupled) to the bottom of conductive channel 712. Accordingly, in this example, conductive channel 792 and conductive channel 712 are coupled in series and are coupled with the respective bit line and the respective source line.

Although each of the conductive channels (e.g., conductive channels 712, 792) in FIG. 7 is illustrated as a single conductive channel, in some embodiments, each of the conductive channels include multiple conductive channels that are in a stacked configuration. For example, the multiple conductive channels in a stacked configuration may be coupled by one or more connectors. For further discussion of 3D memory devices with multiple conductive channels in a stacked configuration, see U.S. patent application Ser. No. 14/272,363, filed May 8, 2014, entitled "Three-Dimensional Memory Device Having Stacked Conductive Channels," which is incorporated herein by reference in its entirety.

In some embodiments, read/write circuitry 760 receives memory operation commands from memory controller 120 (e.g., a read command from data read module 212, a write command from data write module 214, or an erase command from data erase module 216). For example, data is stored in storage elements coupled with word line 728 and read/write circuitry 760 reads bit values from these storage elements. As another example, the read/write circuitry 760 applies selection signals to control lines coupled with word lines 720-728, bit lines 730-734, and source lines 740-742 to cause a programming voltage (e.g., a voltage pulse or series of voltage pulses associated with a threshold voltage) to be applied across selected storage element(s) of the selected word line (e.g., fourth word line 728) so as to write/program data to the selected storage element(s).

For example, during a read operation, memory controller 120 receives a request from the host (e.g., computer system 110, FIG. 1) and, in response, causes read/write circuitry 760 to read bits from particular storage elements of 3D memory device 700 by applying appropriate signals to control lines to cause storage elements of a selected word line to be sensed.

Figure 8:
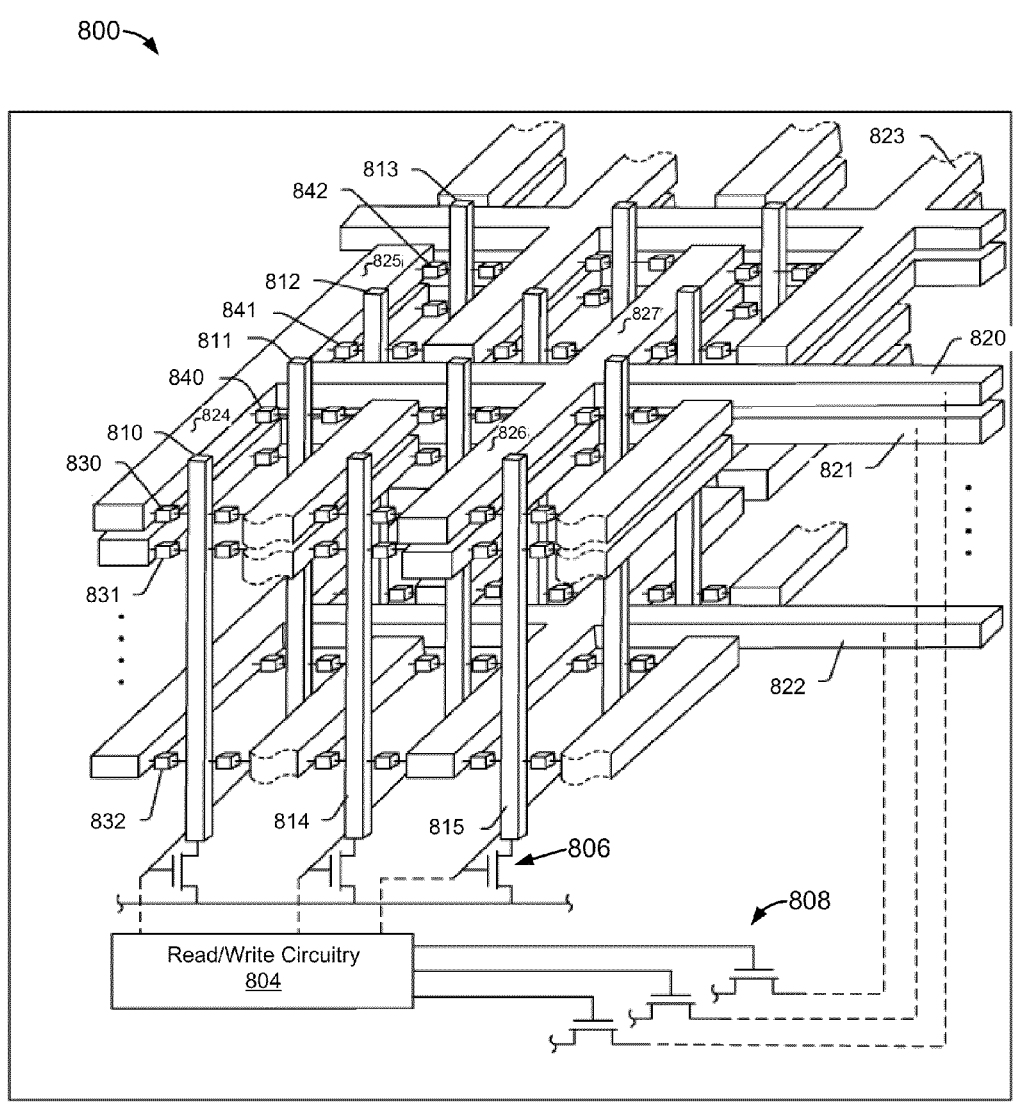
FIG. 8 is a schematic diagram of a 3D memory device in a ReRAM configuration in accordance with some embodiments.

FIG. 8 is a schematic diagram of a 3D memory device 800 in a ReRAM configuration in accordance with some embodiments. For example, 3D memory device 800 corresponds to storage device 130 (FIG. 1). In FIG. 8, 3D memory device 800 includes a vertical bit line Resistive Random Access Memory (ReRAM) with a plurality of conductive lines in physical layers over a substrate (e.g., substantially parallel to a surface of the substrate), such as representative word lines 820, 821, 822, and 823 (only a portion of which are shown in FIG. 8) and a plurality of vertical conductive lines through the physical layers, such as representative bit lines 810, 811, 812, and 813.

In FIG. 8, bit lines 810, 811, 812, and 813, are illustrated as a single bit line; however, in some embodiments, bit lines 810, 811, 812, and 813 include multiple portions in a stacked configuration. For example, the multiple portions in the stacked configuration may be coupled by one or more connectors. For further discussion of 3D memory devices with multiple conductive channels in a stacked configuration, see U.S. patent application Ser. No. 14/272,363, filed May 8, 2014, entitled "Three-Dimensional Memory Device Having Stacked Conductive Channels," which is incorporated herein by reference in its entirety.

In FIG. 8, memory device 800 includes a plurality of resistance-based storage elements (e.g., memory cells), such as representative storage elements 830, 831, 832, 840, 841, and 842, each of which is coupled with a bit line and a word line in arrays of memory cells in multiple physical layers over the substrate (e.g., a silicon substrate). In FIG. 8, memory device 800 also includes read/write circuitry 804 (i.e., read/write circuitry 135 or alternatively read/write circuitry within storage medium I/O 128) coupled with word line drivers 808 and bit line drivers 806.

In FIG. 8, word lines 820, 821, 822, and 823 each include a plurality of fingers (e.g., first word line 820 includes fingers 824, 825, 826, and 827). In some embodiments, a respective finger is coupled with more than one bit line. In FIG. 8, first finger 824 of first word line 820 is coupled with a first bit line 810 via a first storage element 830 at a first end of first finger 824 and is coupled with a second bit line 811 via a second storage element 840 at a second end of first finger 824.

In some embodiments, each bit line is coupled with more than one word line. In FIG. 8, first bit line 810 is coupled with first word line 820 via first storage element 830 and is coupled with a third word line 822 via a third storage element 832.

For example, during a write operation, memory controller 120 receives data from the host (e.g., computer system 110, FIG. 1) and, in response, sends the data (or a representation of the data) to memory device 800. For example, memory controller 120 encodes the data prior to sending the data to memory device 800.

In some embodiments, read/write circuitry 804 writes the data received from memory controller 120 to storage elements of memory device 800 according to the destination of the data. For example, read/write circuitry 804 applies selection signals to selection control lines coupled with word line drivers 808 and bit line drivers 806 to cause a write voltage to be applied across a selected storage element. For example, to select first storage element 830, read/write circuitry 804 activates word line drivers 808 and bit line drivers 806 to drive a programming current (also referred to as a write current) through first storage element 830. For example, a first write current is used to write a first logical value (e.g., a value corresponding to a high-resistance state) to first storage element 830, and a second write current is used to write a second logical value (e.g., a value corresponding to a low-resistance state) to first storage element 830. In this example, programming current is applied by generating a programming voltage across first storage element 830 by applying a first voltage to first bit line 810 and to word lines other than first word line 820 and applying a second voltage to first word line 820. In some embodiments, the first voltage is applied to other bit lines (e.g., bit lines 814 and 815) to reduce leakage current in memory device 800.

For example, during a read operation, memory controller 120 receives a request the host (e.g., computer system 110, FIG. 1) and, in response, causes read/write circuitry 804 to read bits from particular storage elements of memory device 800 by applying selection signals to selection control lines coupled with word line drivers 808 and bit line drivers 806 to cause a read voltage to be applied across a selected storage element. For example, to select first storage element 830, read/write circuitry 804 activates word line drivers 808 and bit line drivers 806 to apply a first voltage (e.g., 0.7 volts (V)) to first bit line 810 and to word lines other than first word line 820. In this example, a lower voltage (e.g., 0 V) is applied to first word line 820. Thus, a read voltage is applied across first storage element 830, and a read current corresponding to the read voltage may be detected at a sense amplifier of read/write circuitry 804. In some embodiments, the read current corresponds (via Ohm's law) to a resistance state of first storage element 830, which corresponds to a logical value stored at first storage element 830. The logical value read from the first storage element 830 and other storage elements during the read operation is provided to memory controller 120. Accordingly, in some embodiments, each of bit lines 810, 811, 812, and 813 includes multiple portions and the multiple portions of a particular bit line may be in a stacked configuration.

Figure 9:
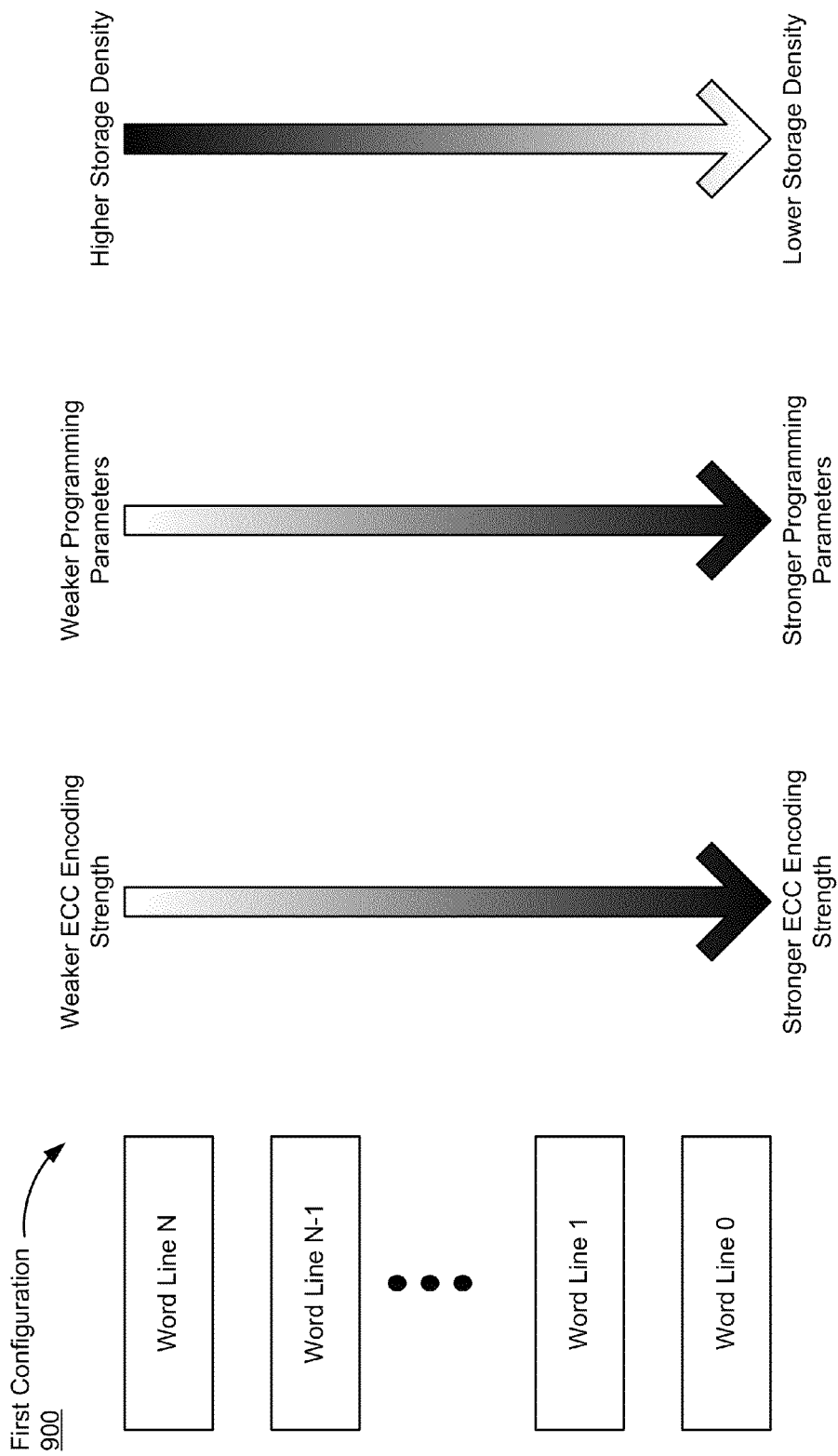
FIG. 9 is a prophetic diagram of a first configuration for word lines comprising a respective block of a 3D memory device in accordance with some embodiments.

FIG. 9 illustrates a prophetic diagram of a first configuration 900 for a 3D memory device (e.g., storage device 130, FIG. 1 configured as one of 3D memory devices 600, 700, or 800 illustrated in FIGS. 6-8, respectively) in accordance with some embodiments. In some embodiments, a 3D memory device includes a plurality of blocks and each block is associated with a plurality of word lines stacked vertically relative to the substrate of the 3D memory device. In some embodiments, each word line includes a plurality of pages. FIG. 9 shows configuration parameters for word lines N, N−1, . . . 1, 0 of a respective block of storage device 130 in first configuration 900. In FIG. 9, word line N is farthest from the substrate of storage device 130 (e.g., the top word line) and word line 0 is closest the substrate of storage device 130 (e.g., the bottom word line).

In some embodiments, characterization vector table 234 (FIGS. 2A-2C) stores characterization vectors 235 for word lines N, N−1, . . . 1, 0 of the respective block of storage device 130. For example, a respective characterization vector for word line N includes a set of configuration parameters including: (i) a storage density field 252 indicating the current storage density configuration for memory cells in word line N; (ii) an ECC encoding strength (or technique) 254 indicating the current ECC encoding strength for data stored in page(s) associated with word line N; and (iii) a programming parameters field 256 indicating one or more programming parameters associated with the data stored, or to be stored, in word line N.

For example, in first configuration 900, the respective characterization vector for word line N includes initial values for the set of configuration parameters. In first configuration 900, the set of configuration parameters associated with a word line depends on the word line's vertical position relative to the substrate of storage device 130 due to the tapering effect discussed herein. In some embodiments, location determination module 222 (FIG. 2A) determines first configuration 900 upon the first power-on of the 3D memory device. For example, upon the first power-on of the 3D memory device, location determination module 222 (FIG. 2A) determines and populates characterization vectors 235 (FIG. 2B) for word lines N, N−1, . . . 1, 0 of the respective block of storage device 130 based on the vertical positions of word lines N, N−1, . . . 1, 0 relative to the substrate of storage device 130. In some embodiments, a page in each word line is programmed with metadata indicating its vertical position relative to the substrate of storage device 130 by the manufacturer of the 3D memory device. In some embodiments, location determination module 222 (FIG. 2A) determines, for each word line of the respective block, a vertical position relative to the substrate of storage device 130 based on a determined variation location (e.g., location 420 in FIGS. 4A-4B and 5-6) for the respective block.

In some embodiments, in first configuration 900, the set of configuration parameters associated with word line 0 (i.e., the word line closest to the substrate of storage device 130) indicates a lower storage density for memory cells in word line 0, a stronger ECC strength for data stored, or to be stored, in pages of word line 0, and stronger (i.e., more intense, destructive, or stressful) programming parameters for data stored, or to be stored, in pages of word line 0 as compared to the set of configuration parameters for word line N (i.e., the word line farthest from the substrate of storage device 130). For example, in first configuration 900, the set of configuration parameters associated with word line 0 indicates that the memory cells in word line 0 are configured to store 1 bit of data (i.e., X1), data stored in the pages of word line 0 are encoded with an LDPC code associated with P parity bits and/or a decoding limit of C CPU cycles or decoding cycles to decode data (e.g., a codeword) encoded with the LDPC code, and that data is programmed to the pages of word line 0 with programming voltage X. Continuing with this example, in comparison, in first configuration 900, the set of configuration parameters associated with word line N indicates that the memory cells in word line N are configured to store 3 bits of data (i.e., X3), data stored in the pages of word line N are encoded with a LDPC code associated with M parity bits and/or a decoding limit of D CPU cycles or decoding cycles to decode data encoded with the LDPC code (where M<P and/or D<C), and that data is programmed to the pages of word line N with programming voltage Y (where Y<X).

Figure 10:
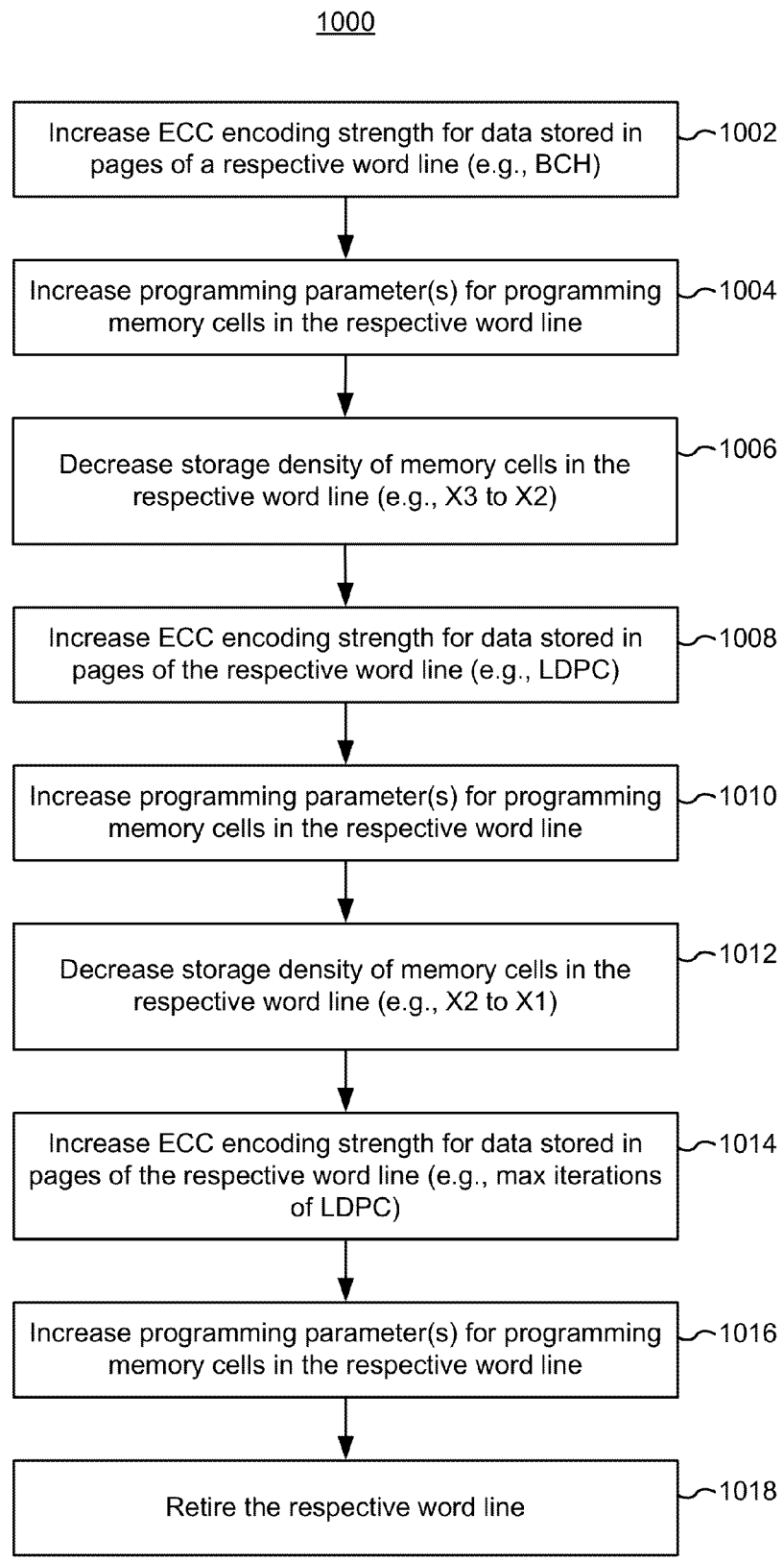
FIG. 10 is a flow diagram of prophetic states of a respective word line of a 3D memory device in accordance with some embodiments.

FIG. 10 illustrates a flow diagram of prophetic states of a respective word line of a 3D memory device during the respective word line's lifespan in accordance with some embodiments. For example, the respective word line discussed in FIG. 10 corresponds to one of the plurality of word lines associated with a respective block of a 3D memory device (e.g., one of the word lines shown in FIG. 9). As discussed with reference to FIG. 9, in first configuration 900, a respective set of configuration parameters (with initial values) corresponds to each of the plurality of word lines associated with the respective block of the 3D memory device. For example, in first configuration 900, the respective set of configuration parameters associated with the respective word line indicates (i) an initial storage density associated memory cells in the respective word line, (ii) an initial ECC encoding strength (or technique) associated with data stored, or to be stored, in pages of the respective word line, and (iii) one or more initial programming parameters associated with data stored, or to be stored, in pages of the respective word line.

In the following discussion, for implementations in which configurations, configuration parameters and status parameters are maintained for groups of contiguous word lines, herein called word line zones, the configurations and configuration parameters for a respective word line are configurations and configuration parameters for the word line zone that includes the respective word line, and the status metrics for a respective word line are status metrics for the word line zone that includes the respective word line.

In some embodiments, in addition to the initial storage density, initial ECC encoding technique, and one or more initial programming parameters associated with the respective word line, a characterization vector for the respective word line (or for a word line zone that includes the word line) includes one or more status metrics associated with the health, endurance, and/or performance of the respective word line (or the word line zone that includes the respective word line). In some embodiments, the one or more status metrics include (a) a number of bytes written to the respective word line (or the word lines in a word line zone) or an average number of bytes written to each page of the respective word line (or word line zone), (b) a count of PE cycles performed on the respective word line (or word line zone), (c) a most recently determined BER for data read from pages of the respective word line (or word line zone) or an average BER for data read from pages of the respective word line (or word line zone), and (d) other usage information associated with the health, endurance, and/or performance of the respective word line (or the word lines in the word line zone). In some embodiments, a combined status metric is computed from the above mentioned factors based on a predetermined algorithm.

For example, in first configuration 900, the one or more configuration parameters for the respective word line indicate that: the memory cells in the respective word line are configured to store 3 bits (i.e., X3); data stored, or to be stored, in pages of the respective word line is encoded with a weak ECC code; and data stored, or to be stored, in pages of the respective word line is programmed with a programming voltage Q. For example, the weak ECC code adds X parity bits to the write data included in a codeword, and/or a codeword encoded with the weak ECC code has a decoding limit of Y CPU cycles or Y decoding cycles to decode.

The flow diagram in FIG. 10 indicates an example sequence of adjustment operations performed on the respective set of configuration parameters associated with the respective word line over the lifespan of (or after usage of) the respective word line.

In some embodiments, the memory controller increases (1002) the ECC encoding strength for data stored in pages of the respective word line. In response to detecting a first trigger condition (e.g., a BER for data read from pages of the respective word line exceeds a first predefined threshold), memory controller 120 or a component thereof (e.g., adjustment module 232, FIG. 2A) increases the value of the ECC encoding strength in the characterization vector associated with the respective word line. For example, the increased value indicates that data stored, or to be stored, in pages of the respective word line is encoded with a stronger ECC code (e.g., a LDPC code instead of a BCH code, or an LDPC code with more ECC bits per codeword) as compared to the initial weak ECC code in first configuration 900. In this example, the stronger ECC code adds more than X parity bits to the write data for a codeword, and/or a codeword decoded with the stronger ECC code has a higher decoding limit (specified in terms of CPU cycles or decoding cycles) that is more than Y.

In some embodiments, the memory controller increases (1004) the intensity of the programming parameter(s) for programming memory cells in the respective word line. In response to detecting a second trigger condition (e.g., a BER for data read from pages of the respective word line exceeds a second predefined threshold that is greater than the first predefined threshold), memory controller 120 or a component thereof (e.g., adjustment module 232, FIG. 2A) increases the value of one or more programming parameters in the characterization vector associated with the respective word line. For example, the increased value indicates that data is stored, or is to be stored, in pages of the respective word line with a programming voltage that is greater than Q, where Q is the initial programming voltage in first configuration 900. In this example, the increased programming voltage, which is greater than Q, wears out memory cells in the respective word line faster; however, the increased programming voltage enables memory cells in the respective word line to better retain data.

In some embodiments, the memory controller decreases (1006) the storage density of memory cells in the respective word line (e.g., X3 to X2). In response to detecting a third trigger condition (e.g., a count of PE cycles performed on the word line exceeds a first predetermined count, or the BER exceeds a predefined threshold after operation 1002 and/or operation 1004 have been performed), memory controller 120 or a component thereof (e.g., adjustment module 232, FIG. 2A) decreases a value corresponding to the storage density of memory cells in the respective word line in the characterization vector for the respective word line. For example, the memory cells in the respective word line are recharacterized from X3 to X2. In some embodiments, data stored in the pages of the respective word line is migrated to pages in other word lines of the 3D memory device prior to the recharacterizing. In some embodiments, the recharacterizing is performed after a subsequent erase operation of the respective block that includes the respective word line. In some embodiments, when performing the recharacterizing, memory controller 120 or a component thereof (e.g., adjustment module 232, FIG. 2A) decreases the value of the ECC encoding strength and/or decreases the value of one or more programming parameters in the characterization vector associated with the respective word line to the initial values in first configuration 900 (e.g., the weak ECC code and the programming voltage Q).

In some embodiments, the memory controller increases (1008) the ECC encoding strength for data stored in pages of the respective word line (e.g., LDPC). After the recharacterizing in operation 1006 and in response to detecting the first trigger condition (e.g., a BER for data read from pages of the respective word line exceeds the first predefined threshold), memory controller 120 or a component thereof (e.g., adjustment module 232, FIG. 2A) increases the value of the ECC encoding strength in the characterization vector associated with the respective word line. For example, the increased value indicates that data stored, or to be stored, in pages of the respective word line is encoded with a stronger ECC code (e.g., LDPC code) as compared to the ECC encoding strength in operation 1002. In another example, the stronger ECC code adds more than X parity bits to the write data included in a each codeword written to the respective word line after operation 1008 has been performed, and/or has a higher decoding limit (e.g., a higher limit on the number of CPU cycles or decoding cycles permitted for decoding a codeword that has been encoded with the stronger ECC code).

In some embodiments, the memory controller increases (1010) the intensity of the programming parameter(s) for memory cells in the respective word line. After the recharacterizing in operation 1006 and in response to detecting the second trigger condition (e.g., a BER for data read from pages of the respective word line exceeds the second predefined threshold that is greater than the first predefined threshold), memory controller 120 or a component thereof (e.g., adjustment module 232, FIG. 2A) increases the value of one or more programming parameters in the characterization vector associated with the respective word line. For example, the increased value indicates that data is stored, or is to be stored, in pages of the respective word line with a programming voltage that is greater than the programming voltage used to write data to the respective word line prior to performing operation 1010. In another example, the increased value indicates that data is stored, or is to be stored, in pages of the respective word line with a programming voltage that is greater than Q (e.g., the initial programming voltage in first configuration 900).

In some embodiments, the memory controller decreases (1012) the storage density of memory cells in the respective word line (e.g., X2 to X1). In response to detecting a fourth trigger condition (e.g., a count of PE cycles performed on the word line exceeds a second predetermined count greater than the first predetermined count), memory controller 120 or a component thereof (e.g., adjustment module 232, FIG. 2A) decreases a value corresponding to the storage density of memory cells in the respective word line in the characterization vector for the respective word line. For example, the memory cells in the respective word line are recharacterized from X2 to X1. In some embodiments, when performing the recharacterizing of operation 1012, memory controller 120 or a component thereof (e.g., adjustment module 232, FIG. 2A) decreases the value of the ECC encoding strength and/or decreases the value of one or more programming parameters in the characterization vector associated with the respective word line to the initial values in first configuration 900 (e.g., the weak ECC code and the programming voltage Q).

In some embodiments, the memory controller increases (1014) the ECC encoding strength for data stored in pages of the respective word line (e.g., max iterations of LDPC). After the recharacterizing in operation 1012 and in response to detecting the first trigger condition (e.g., a BER for data read from pages of the respective word line exceeds the first predefined threshold), memory controller 120 or a component thereof (e.g., adjustment module 232, FIG. 2A) increases the value of the ECC encoding strength in the characterization vector associated with the respective word line. For example, the increased value indicates that data stored, or to be stored, in pages of the respective word line is encoded with a stronger ECC code (e.g., an LDPC code with an increased number of parity bits or ECC bits per codeword) as compared to the ECC encoding strength used when writing data to the respective word line prior to performing operation 1014. In another example, the stronger ECC code adds more than X parity bits to the write data for a single respective codeword to be written to the respective word line, and/or has a higher decoding limit (e.g., a higher limit on the number of CPU cycles or decoding cycles permitted for decoding a codeword that has been encoded with the stronger ECC code) than the ECC code used when writing data to the respective word line prior to the performance of operation 1014.

In some embodiments, the memory controller increases (1016) the intensity of the programming parameter(s) for memory cells in the respective word line. After the recharacterizing in operation 1012 and in response to detecting the second trigger condition (e.g., a BER for data read from pages of the respective word line exceeds the second predefined threshold that is greater than the first predefined threshold), memory controller 120 or a component thereof (e.g., adjustment module 232, FIG. 2A) increases the value of one or more programming parameters in the characterization vector associated with the respective word line. For example, the increased value indicates that data is stored, or is to be stored, in pages of the respective word line with a programming voltage that is greater than the programming voltage in operation 1010. In another example, the increased value indicates that data is stored, or is to be stored, in pages of the respective word line with a programming voltage that is greater than Q (e.g., the initial programming voltage in first configuration 900).

In some embodiments, the memory controller retires (1018) the respective word line. In response to detecting a fifth trigger condition (e.g., a count of PE cycles performed on the word line exceeds a third predetermined count greater than the first and second predetermined counts), memory controller 120 or a component thereof (e.g., adjustment module 232, FIG. 2A) decreases a value corresponding to the storage density of memory cells in the respective word line in the characterization vector for the respective word line. For example, the memory cells in the respective word line are recharacterized from X1 to X0. In this example, X0 indicates that the respective word line is retired whereby new data is not programmed to the pages of the respective word line. In some embodiments, data stored on word lines characterized by a storage density of X0 can continue to be read, and thus these word lines continue to operate as read only memory.

The example sequence of adjustment operations in FIG. 10 is not meant to be limiting. For example, the adjustment operations may be performed in a variety of alternate orders. In some implementations, some of the adjustment operations described above are performed. In some implementations, additional adjustment operations are added (e.g., based on the first configuration associated with the respective word line or other factors). To this end, FIG. 10 shows the example sequence of adjustment operations where configuration parameters are adjusted as follows: ECC encoding strength→programming parameter(s)→storage density; however, the adjustment parameters may be adjusted in various other orders such as (A) ECC encoding strength→ECC encoding strength→programming parameter(s)→storage density, or (B) programming parameter(s)→programming parameter(s)→ECC encoding strength→storage density. In some embodiments, the ECC encoding strength and programming parameter(s) of the respective word line are adjusted prior to the storage density of the respective word line. In some embodiments, the ECC encoding strength and programming parameter(s) of the respective word line are adjusted in accordance with a different trigger (e.g., BER) than the trigger for adjusting the storage density of the respective word line (e.g., PE cycles performed on the respective word line).

In some embodiments, characterization vectors are stored on a word line zone basis (i.e., a subset of the word lines in a block), instead of an individual word line basis. As a result, trigger conditions are detected on a word line zone basis and, in response, configuration parameters are adjusted on a word line zone basis as well. For example, when 12 word lines comprise a block, the 12 word lines are split into two or three word line zones, which may or may not include equal number of word lines. In another example, when a block is divided by a determined variation location for the block, word lines above the variation location (i.e., farther from the substrate) are included in a first word line zone and word lines below the variation location (i.e., closer to the substrate) are included in a second word line zone.

Figure 11A:
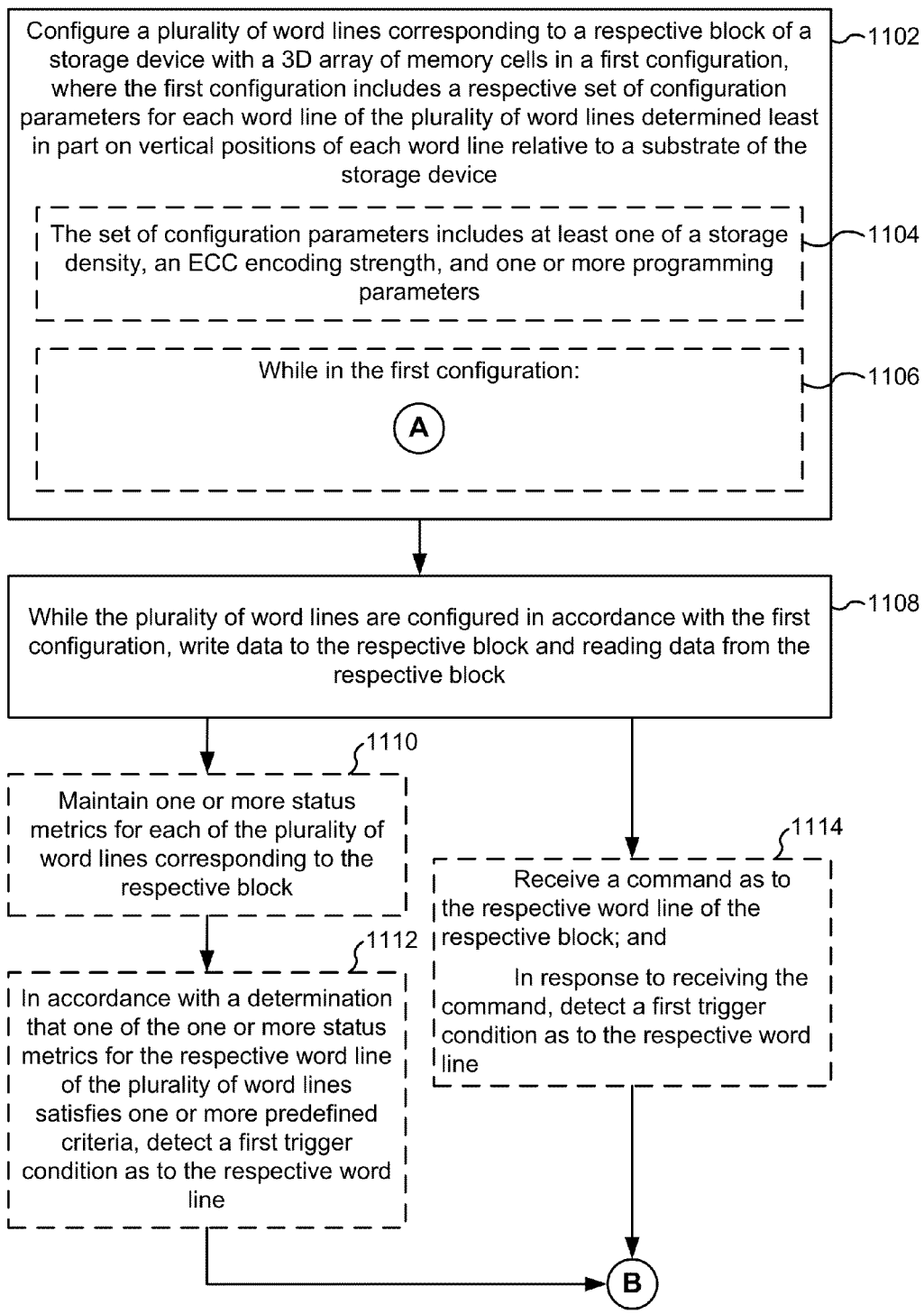
Figure 11B:
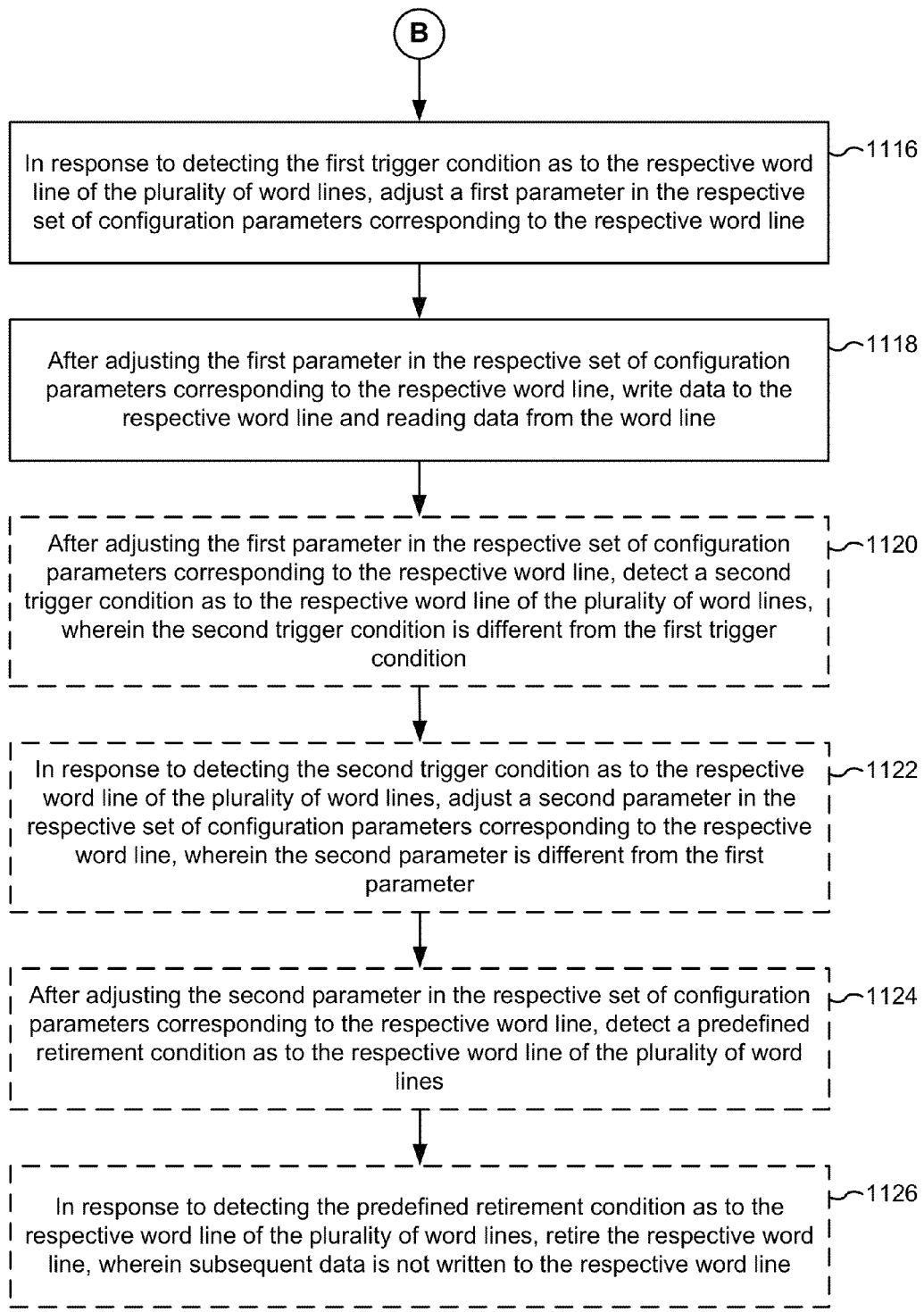

FIGS. 11A-11C illustrate a flowchart representation of a method 1100 of operation in a storage device with a 3D array of memory cells in accordance with some embodiments. At least in some implementations, method 1100 is performed by a memory controller (e.g., memory controller 120, FIG. 1) or one or more components thereof (e.g., management module 121, FIGS. 1 and 2A). In some embodiments, method 1100 is performed by a memory controller (e.g., memory controller 120, FIG. 1) distinct from and coupled with the storage device (e.g., storage device 130, FIG. 1) by one or more connections (e.g., connections 103, FIG. 1). In some embodiments, method 1100 is governed by instructions that are stored in a non-transitory computer readable storage medium and the instructions are executed by one or more processors of a device (e.g., one or more processing units (CPUs) 122 of management module 121, FIGS. 1 and 2A). Optional operations are indicated by dashed lines (e.g., boxes with dashed-line borders).

In some embodiments, the storage device (e.g., storage device 130, FIG. 1) includes one or more memory devices. A respective memory device of the one or more memory devices includes a three-dimensional array of memory cells and a plurality of blocks of memory cells. In some embodiments, each block includes a plurality of word lines arranged in different vertical positions relative to a substrate of the storage device.

In some embodiments, the plurality of word lines include a set of word lines at each vertical position of X distinct vertical positions relative to the substrate of the storage device, where X is an integer greater than two. In some embodiments, each word line includes one or more pages, each page for storing user data and ECC values for detecting and correcting errors in the user data stored in the page. In FIG. 9, for example, a respective block of the plurality of blocks in a 3D memory device is associated with word lines word lines N, N−1, ... 1, 0, where word line N is farthest from the substrate of 3D memory device (e.g., the top word line) and word line 0 is closest the substrate of 3D memory device (e.g., the bottom word line).

The memory controller configures (1102) the plurality of word lines corresponding to the respective block in a first configuration, where the first configuration includes a respective set of configuration parameters for each word line of the plurality of word lines determined at least in part on the vertical positions of each word line relative to the substrate of the storage device. FIG. 9, for example, schematically depicts configuration parameters for word lines N, N−1, ... 1, 0 of a respective block of storage device 130 in first configuration 900. In some embodiments, characterization vector table 234 (FIGS. 2A-2C) stores characterization vectors 235 for word lines N, N−1, ... 1, 0 of the respective block of storage device 130. For example, in first configuration 900, the respective characterization vector for word line N includes initial values for the set of configuration parameters. In some embodiments, location determination module 222 (FIG. 2A) determines first configuration 900 upon the first power-on of the 3D memory device. For example, upon startup or power-on of the 3D memory device, location determination module 222 (FIG. 2A) determines and populates characterization vectors 235 (FIG. 2B) for word lines N, N−1, ... 1, 0 of the respective block of storage device 130 based on the vertical positions of word lines N, N−1, ... 1, 0 relative to the substrate of storage device 130. In some embodiments, a page in each word line is programmed with metadata indicating its vertical position relative to the substrate of storage device 130 by the manufacturer of the 3D memory device. In some embodiments, location determination module 222 (FIG. 2A) determines, for each word line of the respective block, a vertical position relative to the substrate of storage device 130 based on a determined variation location (e.g., location 420 in FIGS. 4A-4B and 5-6) for the block.

In some embodiments, the respective set of configuration parameters includes (1104) at least one of a storage density, an ECC encoding strength, and one or more programming parameters. In some embodiments, characterization vector table 234 stores characterization vectors 235 for word lines N, N−1, ... 1, 0 of the respective block of storage device 130. With respect to FIG. 9, for example, a respective characterization vector for word line N includes a set of configuration parameters including: (i) a storage density field 252 indicating the current storage density configuration for memory cells in word line N; (ii) an ECC encoding strength (or technique) 254 indicating the current ECC encoding strength for data stored in page(s) associated with word line N; and (iii) a programming parameters field 256 indicating one or more programming parameters associated with the data stored, or to be stored, in word line N.

In some embodiments, while in the first configuration (1106): a first subset of the plurality of word lines corresponding to the respective block, at a first subset of the vertical positions, is configured (1128) to store data at a first storage density, the first storage density corresponding to storage of B bits per memory cell, where the predefined number of bits, B, is greater than zero; and a second subset of the plurality of word lines corresponding to the respective block, at a second subset of the vertical positions, is configured to store data at a second storage density, the second storage density corresponding to storage of M bits per memory cell, where M is greater than zero and M is less than B. With reference to FIG. 9, in first configuration 900, the set of configuration parameters associated with word line 0 (i.e., the word line closest to the substrate of storage device 130) indicates a lower storage density for memory cells in word line 0, as compared to the storage density field in the set of configuration parameters for word line N (i.e., the word line farthest from the substrate of storage device 130). For example, in first configuration 900, the set of configuration parameters associated with word line 0 indicates that the memory cells in word line 0 are configured as X1 memory cells, configured to store 1 bit of data per memory cell. Continuing with this example, in comparison, in first configuration 900, the set of configuration parameters associated with word line N indicates that the memory cells in word line N are configured as X3 memory cells, configured to store 3 bits of data per memory cell.

In some embodiments, while in the first configuration (1106): a first subset of the plurality of word lines corresponding to the respective block, at a first subset of the vertical positions, is configured (1130) to store data encoded with a first ECC encoding strength; and a second subset of the plurality of word lines corresponding to the respective block, at a second subset of the vertical positions, is configured to store data encoded with a second ECC encoding strength greater than the first ECC encoding strength. For example, the second ECC encoding strength requires more ECC or parity bits per codeword, and/or has a higher decoding limit than the first ECC encoding strength. With reference to FIG. 9, in first configuration 900, the set of configuration parameters associated with word line 0 (i.e., the word line closest to the substrate of storage device 130) indicates a stronger ECC strength for data stored, or to be stored, in pages of word line 0 as compared to the ECC encoding strength in the set of configuration parameters for word line N (i.e., the word line farthest from the substrate of storage device 130). For example, in first configuration 900, the set of configuration parameters associated with word line 0 indicates that data stored in the pages of word line 0 are encoded with an LDPC code associated with P parity bits and/or a decoding limit of C CPU cycles or C decoding cycles. Continuing with this example, in comparison, in first configuration 900, the set of configuration parameters associated with word line N indicates that data stored in the pages of word line N are encoded with a LDPC code associated with K parity bits and/or a decoding limit of D CPU cycles or D decoding cycles (where K<P and/or D<C).

In some embodiments, while in the first configuration (1106): a first subset of the plurality of word lines corresponding to the respective block, at a first subset of the vertical positions, is configured (1132) to store data according to a first set of one or more programming parameters; and a second subset of the plurality of word lines corresponding to the respective block, at a second subset of the vertical positions, is configured to store data according to a second set of one or more programming parameters. With reference to FIG. 9, in first configuration 900, the set of configuration parameters associated with word line 0 (i.e., the word line closest to the substrate of storage device 130) indicates stronger (i.e., more intense, destructive, or stressful) programming parameter(s) for data stored, or to be stored, in pages of word line 0 as compared to the programming parameter(s) in the set of configuration parameters for word line N (i.e., the word line farthest from the substrate of storage device 130). For example, in first configuration 900, the set of configuration parameters associated with word line 0 indicates that data is programmed to the pages of word line 0 with programming voltage X. Continuing with this example, in comparison, in first configuration 900, the set of configuration parameters associated with word line N indicates that data is programmed to the pages of word line N with programming voltage Y (where Y<X).

In some embodiments, the second set of one or more programming parameters exposes (1134) memory cells in the second subset of the plurality of word lines corresponding to the respective block to a greater amount of stress than the first set of one or more programming parameters. In some embodiments, the one or more programming parameters correspond to a programming voltage, a number of programming pulses, a step, width, or duration of each programming pulse, and/or one or more reading threshold voltages for each state of memory cells in the respective word line. For example, the second set of one or more programming parameters includes a higher programming voltage for programming memory cells in the respective word line in comparison to the programming voltage in the first set of one or more programming parameters. Continuing with this example, the higher programming voltage is more stressful or destructive on the memory cells in the respective word line; in other words, the higher programming voltage causes memory cells programmed using the higher programming voltage to wear faster that memory cells programmed using a lower programming voltage.

In some embodiments, the second subset of the vertical positions corresponding to the second subset of the plurality of word lines corresponding to the respective block are (1136) closer to the substrate of the storage device than the first subset of the vertical positions corresponding to the first subset of the plurality of word lines corresponding to the respective block. For example, with reference to the word lines in FIG. 9, the second subset of the vertical positions corresponding to the second subset of the plurality of word lines correspond to word lines 1 and 0, and the first subset of the vertical positions corresponding to the first subset of the plurality of word lines corresponds to word lines N−1 and N.

While the plurality of word lines are configured in accordance with the first configuration, the memory controller writes (1108) data to the respective block and reads data from the respective block. In some embodiments, memory controller 120 causes data to be written to and read from pages in a respective word line of the respective block according to the one or more configuration parameters (e.g., storage density, ECC encoding strength, and programming parameter(s)) indicated in a characterization vector for the respective word line. For example, memory controller 120 receives a command from the host (e.g., computer system 110, FIG. 1) to write user data (sometimes also called write data) to a logical address or set of logical addresses. Continuing with this example, memory controller 120 uses logical-to-physical mapping 236 (FIG. 2A) to map the logical address or set of logical addresses identified by the write command to physical addresses of one or more pages in a respective word line of a respective block of storage device 130. Continuing with this example, memory controller 120 selects a characterization vector associated with the respective word line from characterization vector table 234 (FIGS. 2A-2B) based on the physical addresses so as to determine an ECC encoding strength with which to encode the user data, programming parameter(s) for writing the user data to the one or more pages, and the current storage density associated with memory cells in the respective word line. Continuing with this example, encoder 126 (FIG. 1) encodes the user data according to the determined ECC encoding strength, and memory controller 120 or a component thereof (e.g., data read module 212, FIG. 2A or data write module 214, FIG. 2A) causes read/write circuitry in storage medium I/O 128 (FIG.

1) or read/write circuitry 135 (FIG. 1) to write the encoded user data (i.e., a codeword) to the one or more pages in the respective word line according to the determined programming parameter(s).

In some embodiments, the memory controller maintains (1110) one or more status metrics for each of the plurality of word lines corresponding to the respective block. In some embodiments, memory controller 120 or a component thereof (e.g., metric maintaining module 228, FIG. 2A) maintains one or more status metrics for each of the plurality of word lines corresponding to the respective block. In some embodiments, the one or more status metrics associated with a respective word line are stored in a characterization vector corresponding to the respective word line (or in a characterization vector corresponding to the word line zone that includes the respective word line). In some embodiments, the one or more status metrics stored in the characterization vector for the respective word line (or word line zone) include: (a) a bytes written field 260 indicating a number of bytes of data written to pages in the respective word line (or word line zone); (b) a PE cycle field 262 indicating a current count of the number of PE cycles performed on the respective word line; (c) an BER field 264 indicating a number of errors included in a codeword read from pages of the respective word line; and (d) other usage information 266 indicating the health, performance, and/or endurance of the respective word line.

In some embodiments, memory controller 120 or a component thereof (e.g., metric maintaining module 228, FIG. 2A) maintains a combined status metric for each of the plurality of word lines (or each of a plurality of word line zones) in the respective block. In some embodiments, the combined status metric associated with a respective word line (or word line zone) is stored in a characterization vector corresponding to the respective word line (or word line zone). In some embodiments, combined status metric 258 is associated with the output of a predefined algorithm (e.g., computed by metric maintaining module 228, FIG. 2A) that takes into account one or more usage parameters associated with the respective word line (or word line zone). For example, the predefined algorithm incorporates one or more of: (a) a number of bytes written to the respective word line (or word line zone); (b) a number of PE cycles performed on respective word line; (c) a BER for codewords read from page(s) of the respective word line (or word line zone); and (d) other usage information associated with respective word line (or word line zone).

In some embodiments, in accordance with a determination that one of the one or more status metrics for the respective word line of the plurality of word lines satisfies one or more predefined criteria, the memory controller detects (1112) a first trigger condition as to the respective word line. In some embodiments, in accordance with a determination that one of the one or more status metrics corresponding to a respective word line satisfy the one or more predefined criteria, memory controller 120 or a component thereof (e.g., trigger detection module 230, FIG. 2A) detects the first trigger condition as to the respective word line. For example, memory controller 120 detects the first trigger condition for a respective word line when the one or more status metrics corresponding to the respective word line indicate that an average number of bytes written to pages in the respective word line exceeds a predetermined number of bytes, or that the average BER for data read from pages of the word line exceeds a predefined value. As such, memory controller 120 triggers adjustment of at least one of the configuration parameter(s) that correspond to the respective word line as discussed below such as increasing the ECC encoding strength for subsequent data written to pages of the respective word line, changing programming parameter(s) for the respective word line, or decreasing storage density of memory cells in the respective word line).

In some embodiments, the memory controller receives (1114) a command as to the respective word line of the respective block and, in response to receiving the command, detects the first trigger condition as to the respective word line. In some embodiments, memory controller 120 or a component thereof (e.g., trigger detection module 230, FIG. 2A) detects the trigger condition as to the respective word line in response to receiving a command from computer system 100, a process internal to data storage system 100, or an accelerator module associated with storage device 130 to adjust the configuration parameter(s) of the respective word line.

In response to detecting a first trigger condition (e.g., based on BER or a command) as to a respective word line of the plurality of word lines, the memory controller adjusts (1116) a first parameter in the respective set of configuration parameters corresponding to the respective word line. In this context, "adjusting" means "changing a value of" In some embodiments, in response to detecting the first trigger condition as to the respective word line, memory controller 120 or a component thereof (e.g., adjustment module 232, FIG. 2A) adjusts at least one of the configuration parameters associated with the respective word line such as the storage density, ECC encoding strength, and/or one or more programming parameter(s). In some embodiments, the configuration parameters for the respective word line are adjusted according to a priority schedule (e.g., ECC encoding strength→programming parameter(s)→storage density as illustrated by the example sequence of adjustment operations in FIG. 10). In some embodiments, the configuration parameters for the respective word line are adjusted by associating with the respective word line a predefined characterization vector having the adjusted configuration parameters.

For example, in response to detecting the first trigger condition as to the respective word line, adjustment module 232 increases the ECC encoding strength for data stored, or to be stored, in pages(s) of the respective word line by changing the value in ECC encoding strength field 254 of the characterization vector corresponding to the respective word line. Alternatively, the ECC encoding strength for the respective word line is increased by associating with the respective word line a predefined characterization vector that specifies the increased ECC encoding strength. Continuing with this example, the previous value in ECC encoding strength field 254 of the characterization vector corresponding to the respective word line indicated that data was stored, or to be stored, in pages(s) of the respective word line with a first code (e.g., a BCH code) whereas the adjusted value in ECC encoding strength field 254 of the characterization vector corresponding to the respective word line indicates that data is stored, or to be stored, in pages(s) of the respective word line with a second code (e.g., an LDPC code) with more parity bits and/or a higher decoding limit than the first code.

After adjusting the first parameter in the respective set of configuration parameters corresponding to the respective word line, the memory controller writes (1118) data to the respective word line and reads data from the respective word line. For example, after updating the characterization vector for the respective word line by adjusting the value of the ECC encoding strength field, memory controller 120 causes data to be written to and read from pages in the respective word line of the respective block according to the configuration parameters (e.g., storage density, adjusted ECC encoding strength, and programming parameter(s)) indicated in the updated characterization vector for the respective word line.

In some embodiments, after adjusting the first parameter in the respective set of configuration parameters corresponding to the respective word line, the memory controller detects (1120) a second trigger condition as to the respective word line of the plurality of word lines, where the second trigger condition is different from the first trigger condition. In some embodiments, in accordance with a determination that the at least one of the one or more status metrics corresponding to a respective word line satisfies one or more predefined criteria, memory controller 120 or a component thereof (e.g., trigger detection module 230, FIG. 2A) detects a second trigger condition as to the respective word line (e.g., different from the first trigger condition in operation 1112). For example, memory controller 120 detects the second trigger condition for a respective word line when the one or more status metrics corresponding to the respective word line indicate that a count of PE cycles performed on the respective word line exceeds a predetermined count. For example, the first trigger condition was detected in accordance with a determination that the BER associated with data read from pages of the respective word line exceeded a predetermined threshold, and the second trigger is detected in accordance with a determination that the count of PE cycles performed on the respective word line exceeds a predetermined count. For example, the predetermined count of PE cycles indicates that the respective word line is nearing end-of-life conditions in the current storage density configuration.

In some embodiments, in response to detecting the second trigger condition as to the respective word line of the plurality of word lines, the memory controller adjusts (1122) a second parameter in the respective set of configuration parameters corresponding to the respective word line, where the second parameter is different from the first parameter. For example, after updating the characterization vector corresponding to the respective word line by adjusting the value of the ECC encoding field in operation 1116 (or, alternatively, by adjusting value of the programming parameter(s) field) in response to detecting the first trigger condition, memory controller 120 or a component thereof (e.g., adjustment module 232, FIG. 2A) updates the characterization vector corresponding to the respective word line by adjusting the value of storage density field 252 in response to detecting the second trigger condition. Alternatively, the storage density for the respective word line is decreased by associating with the respective word line a predefined characterization vector that specifies the decreased storage density. Continuing with this example, the previous value in storage density field 252 of the characterization vector corresponding to the respective word line indicated that the memory cells in the respective word line were configured as X2 memory cells whereas the adjusted value in storage density field 252 of the characterization vector corresponding to the respective word line indicates that the memory cells in the respective word line are configured as X1 memory cells.

In some embodiments, after adjusting the second parameter in the respective set of configuration parameters corresponding to the respective word line, the memory controller detects (1124) a predefined retirement condition as to the respective word line of the plurality of word lines. In some embodiments, controller 120 or a component thereof (e.g., trigger detection module 230, FIG. 2A) detects the predefined retirement condition as to a respective word line in accordance with a determination that the respective word line is configured in a predefined storage density and the one or more status metrics associated with the respective word line satisfy one or more predefined criteria. For example, trigger detection module 230 detects the retirement condition as to a respective word line when the memory cells in the word line are configured as X1 memory cells (e.g., SLC), and a PE count for the respective word line exceeds a predetermined count or the BER for data read from pages of the respective word line exceeds a predetermined threshold.

In some embodiments, in response to detecting the predefined retirement condition as to the respective word line of the plurality of word lines, the memory controller retires (1126) the respective word line, where subsequent data is not written to the respective word line. In some embodiments, memory controller 120 or a component thereof (e.g., adjustment module 232, FIG. 2A) updates the characterization vector corresponding to the respective word line by adjusting the value of storage density field 252 in response to detecting the retirement condition. Continuing with this example, the previous value in storage density field 252 of the characterization vector corresponding to the respective word line indicated that the memory cells in the respective word line were configured as X1 (e.g., SLC) whereas the adjusted value in storage density field 252 of the characterization vector corresponding to the respective word line indicates that the memory cells in the respective word line are configured as X0. Alternatively, the storage density for the respective word line is changed to X0 by associating with the respective word line a predefined characterization vector that specifies X0 storage density. In some embodiments, a memory cell configured as X0 is retired, or used as read only memory, and the memory cell is not available for further programming.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible (e.g., a NOR memory array). NAND and NOR memory configurations are exemplary, and memory elements may be otherwise configured.

The semiconductor memory elements located within and/or over a substrate may be arranged in two or three dimensions, such as a two dimensional memory structure or a three-dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three-dimensional memory structure may be vertically arranged as a stack of multiple two dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three-dimensional arrangement of memory elements with elements on multiple vertically stacked memory planes. Other configurations of memory elements in three dimensions can also constitute a three-dimensional memory array.

By way of non-limiting example, in a three-dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two dimensional memory arrays or three-dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The term "three-dimensional memory device" (or 3D memory device) is herein defined to mean a memory device having multiple layers or multiple levels (e.g., sometimes called multiple memory levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

A person skilled in the art will recognize that the invention or inventions descried and claimed herein are not limited to the two dimensional and three-dimensional exemplary structures described here, and instead cover all relevant memory structures suitable for implementing the invention or inventions as described herein and as understood by one skilled in the art.

It will be understood that, although the terms "first," "second," etc. may be used herein to describe various elements, these elements should not be limited by these terms. These terms are only used to distinguish one element from another. For example, a first trigger condition could be termed a second trigger condition, and, similarly, a second trigger condition could be termed a first trigger condition, without changing the meaning of the description, so long as all occurrences of the "first trigger condition" are renamed consistently and all occurrences of the "second trigger condition" are renamed consistently. The first trigger condition and the second trigger condition are both trigger conditions, but they are not the same trigger condition.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method of operation in a storage device that includes a three-dimensional array of memory cells, including multiple blocks of memory cells, each block including a plurality of word lines arranged in different vertical positions relative to a substrate of the storage device, the method comprising:
   for a respective block of the multiple blocks, performing operations including:
       configuring the plurality of word lines corresponding to the respective block in a first configuration, wherein the first configuration includes a respective set of configuration parameters for each word line of the plurality of word lines determined at least in part on the vertical positions of each word line relative to the substrate of the storage device;
       while the plurality of word lines are configured in accordance with the first configuration, writing data to the respective block and reading data from the respective block;
       in response to detecting a first trigger condition as to a respective word line of the plurality of word lines, adjusting a first parameter in the respective set of configuration parameters corresponding to the respective word line; and
       after adjusting the first parameter in the respective set of configuration parameters corresponding to the respective word line, writing data to the respective word line and reading data from the respective word line.

2. The method of claim 1, further comprising:
   for the respective block:
       after adjusting the first parameter in the respective set of configuration parameters corresponding to the respective word line, detecting a second trigger condition as to the respective word line of the plurality of word lines, wherein the second trigger condition is different from the first trigger condition; and
       in response to detecting the second trigger condition as to the respective word line of the plurality of word lines, adjusting a second parameter in the respective set of configuration parameters corresponding to the respective word line, wherein the second parameter is different from the first parameter.

3. The method of claim 2, further comprising:
   after adjusting the second parameter in the respective set of configuration parameters corresponding to the respective word line, detecting a predefined retirement condition as to the respective word line of the plurality of word lines; and
   in response to detecting the predefined retirement condition as to the respective word line of the plurality of word lines, retiring the respective word line, wherein subsequent data is not written to the respective word line.

4. The method of claim 1, wherein the respective set of configuration parameters includes at least one of a storage density, an ECC encoding strength, and one or more programming parameters.

5. The method of claim 1, further comprising:
   maintaining one or more status metrics for each of the plurality of word lines corresponding to the respective block.

6. The method of claim 5, further comprising:
   in accordance with a determination that one of the one or more status metrics for the respective word line of the plurality of word lines satisfies one or more predefined criteria, detecting the first trigger condition as to the respective word line.

7. The method of claim 1, further comprising:
   receiving a command as to the respective word line of the respective block; and
   in response to receiving the command, detecting the first trigger condition as to the respective word line.

8. The method of claim 1, wherein:
   while in the first configuration:
       a first subset of the plurality of word lines corresponding to the respective block, at a first subset of the vertical positions, is configured to store data at a first storage density, the first storage density corresponding to storage of B bits per memory cell, wherein the predefined number of bits is greater than zero; and
       a second subset of the plurality of word lines corresponding to the respective block, at a second subset of the vertical positions, is configured to store data at a second storage, the second storage density corresponding to storage of M bits per memory cell, wherein M is greater than zero and M is less than B.

9. The method of claim 8, wherein the second subset of the vertical positions corresponding to the second subset of the plurality of word lines corresponding to the respective block are closer to the substrate of the storage device than the first subset of the vertical positions corresponding to the first subset of the plurality of word lines corresponding to the respective block.

10. The method of claim 1, wherein:
    while in the first configuration:
        a first subset of the plurality of word lines corresponding to the respective block, at a first subset of the vertical positions, is configured to store data encoded with a first ECC encoding strength; and
        a second subset of the plurality of word lines corresponding to the respective block, at a second subset of the vertical positions, is configured to store data encoded with a second ECC encoding strength greater than the first ECC encoding strength.

11. The method of claim 1, wherein:
    while in the first configuration:
        a first subset of the plurality of word lines corresponding to the respective block, at a first subset of the vertical positions, is configured to store data according to a first set of one or more programming parameters; and a second subset of the plurality of word lines corresponding to the respective block, at a second subset of the vertical positions, is configured to store data according to a second set of one or more programming parameters.

12. The method of claim 11, wherein the second set of one or more programming parameters exposes memory cells in the second subset of the plurality of word lines corresponding to the respective block to a greater amount of stress than the first set of one or more programming parameters.

13. The method of claim 1, wherein the plurality of word lines include a set of word lines at each vertical position of X distinct vertical positions relative to the substrate of the storage device, wherein X is an integer greater than two.

14. The method of claim 1, wherein the storage device comprises one or more three-dimensional (3D) memory devices, each with a 3D array of memory cells, and circuitry associated with operation of memory elements in the one or more 3D memory devices.

15. The method of claim 14, wherein the circuitry and one or more memory elements in a respective 3D memory device, of the one or more 3D memory devices, are on the same substrate.

16. A storage system, comprising:
a storage device that includes a three-dimensional array of memory cells, including multiple blocks of memory cells, each block including a plurality of word lines arranged in different vertical positions relative to a substrate of the storage device; and
a memory controller with one or more processors and memory storing one or more programs to be executed by the one or more processors, the one or more programs comprising instructions for:
for a respective block of the multiple blocks, performing operations including:
configuring the plurality of word lines corresponding to the respective block in a first configuration, wherein the first configuration includes a respective set of configuration parameters for each word line of the plurality of word lines determined at least in part on the vertical positions of each word line relative to the substrate of the storage device;
while the plurality of word lines are configured in accordance with the first configuration, writing data to the respective block and reading data from the respective block;
in response to detecting a first trigger condition as to a respective word line of the plurality of word lines, adjusting a first parameter in the respective set of configuration parameters corresponding to the respective word line; and
after adjusting the first parameter in the respective set of configuration parameters corresponding to the respective word line, writing data to the respective word line and reading data from the respective word line.

17. The storage system of claim 16, wherein the one or more programs further comprise instructions for:
for the respective block:
after adjusting the first parameter in the respective set of configuration parameters corresponding to the respective word line, detecting a second trigger condition as to the respective word line of the plurality of word lines, wherein the second trigger condition is different from the first trigger condition; and
in response to detecting the second trigger condition as to the respective word line of the plurality of word lines, adjusting a second parameter in the respective set of configuration parameters corresponding to the respective word line, wherein the second parameter is different from the first parameter.

18. The storage system of claim 17, wherein the one or more programs further comprise instructions for:
after adjusting the second parameter in the respective set of configuration parameters corresponding to the respective word line, detecting a predefined retirement condition as to the respective word line of the plurality of word lines; and
in response to detecting the predefined retirement condition as to the respective word line of the plurality of word lines, retiring the respective word line, wherein subsequent data is not written to the respective word line.

19. The storage system of claim 16, wherein the one or more programs further comprise instructions for:
maintaining one or more status metrics for each of the plurality of word lines corresponding to the respective block.

20. The storage system of claim 19, wherein the one or more programs further comprise instructions for:
in accordance with a determination that one of the one or more status metrics for the respective word line of the plurality of word lines satisfies one or more predefined criteria, detecting the first trigger condition as to the respective word line.

21. A non-transitory computer readable storage medium storing one or more programs, the one or more programs comprising instructions, which, when executed by a memory controller with one or more processors, cause the memory controller to perform operations comprising:
for a respective block of a storage device, coupled with the memory controller, that includes a three-dimensional array of memory cells, including multiple blocks of memory cells, each block including a plurality of word lines arranged in different vertical positions relative to a substrate of the storage device; performing operations including:
configuring the plurality of word lines corresponding to the respective block in a first configuration, wherein the first configuration includes a respective set of configuration parameters for each word line of the plurality of word lines determined at least in part on the vertical positions of each word line relative to the substrate of the storage device;
while the plurality of word lines are configured in accordance with the first configuration, writing data to the respective block and reading data from the respective block;
in response to detecting a first trigger condition as to a respective word line of the plurality of word lines, adjusting a first parameter in the respective set of configuration parameters corresponding to the respective word line; and
after adjusting the first parameter in the respective set of configuration parameters corresponding to the respective word line, writing data to the respective word line and reading data from the respective word line.

22. The non-transitory computer readable storage medium of claim 21, wherein the instructions cause the memory controller to perform operations further comprising:
for the respective block:
after adjusting the first parameter in the respective set of configuration parameters corresponding to the respective word line, detecting a second trigger condition as to the respective word line of the plurality of word lines, wherein the second trigger condition is different from the first trigger condition; and in response to detecting the second trigger condition as to the respective word line of the plurality of word lines, adjusting a second parameter in the respective set of configuration parameters corresponding to the respective word line, wherein the second parameter is different from the first parameter.

23. The non-transitory computer readable storage medium of claim 22, wherein the instructions cause the memory controller to perform operations further comprising:

after adjusting the second parameter in the respective set of configuration parameters corresponding to the respective word line, detecting a predefined retirement condition as to the respective word line of the plurality of word lines; and in response to detecting the predefined retirement condition as to the respective word line of the plurality of word lines, retiring the respective word line, wherein subsequent data is not written to the respective word line.

24. The non-transitory computer readable storage medium of claim 21, wherein the instructions cause the memory controller to perform operations further comprising:

maintaining one or more status metrics for each of the plurality of word lines corresponding to the respective block.

25. The non-transitory computer readable storage medium of claim 24, wherein the instructions cause the memory controller to perform operations further comprising:

in accordance with a determination that one of the one or more status metrics for the respective word line of the plurality of word lines satisfies one or more predefined criteria, detecting the first trigger condition as to the respective word line.

* * * * *